(12) United States Patent
Yamazaki et al.

(10) Patent No.: US 7,863,155 B2
(45) Date of Patent: Jan. 4, 2011

(54) MANUFACTURING METHOD OF SEMICONDUCTOR SUBSTRATE AND SEMICONDUCTOR DEVICE

(75) Inventors: Shunpei Yamazaki, Setagaya (JP); Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 154 days.

(21) Appl. No.: 12/155,053

(22) Filed: May 29, 2008

(65) Prior Publication Data

US 2008/0299744 A1 Dec. 4, 2008

(30) Foreign Application Priority Data

Jun. 1, 2007 (JP) ............... 2007-146889

(51) Int. Cl.
*H01L 21/30* (2006.01)
(52) U.S. Cl. ............... 438/458; 438/464; 257/E21.568; 257/E21.57
(58) Field of Classification Search ............... 438/455, 438/458, 464; 257/E21.568, E21.57
See application file for complete search history.

(56) References Cited

U.S. PATENT DOCUMENTS

| 5,013,681 | A | * | 5/1991 | Godbey et al. ............... 438/459 |
| 6,372,609 | B1 | | 4/2002 | Aga et al. |
| 6,818,529 | B2 | | 11/2004 | Bachrach et al. |
| 6,953,736 | B2 | * | 10/2005 | Ghyselen et al. ............ 438/458 |
| 7,119,365 | B2 | | 10/2006 | Takafuji et al. |
| 7,315,064 | B2 | * | 1/2008 | Mitani et al. ................ 257/347 |
| 2005/0247932 | A1 | | 11/2005 | Huang et al. |
| 2008/0283848 | A1 | | 11/2008 | Yamazaki |

FOREIGN PATENT DOCUMENTS

| JP | 64-061943 | 3/1989 |
| JP | 11-163363 | 6/1999 |
| JP | 2003-324188 | 11/2003 |

OTHER PUBLICATIONS

International Search Report (Application No. PCT/JP2008/059602) dated Aug. 19, 2008.
Written Opinion (Application No. PCT/JP2008/059602) dated Aug. 19, 2008.

* cited by examiner

*Primary Examiner*—Khiem D Nguyen
(74) *Attorney, Agent, or Firm*—Eric J. Robinson; Robinson Intellectual Property Law Office, P.C.

(57) ABSTRACT

It is an object of the present invention to obtain a large-sized SOI substrate by providing a single-crystal silicon layer over a large-sized glass substrate in a large area. After a plurality of rectangular single-crystal semiconductor substrates each provided with a separation layer are aligned over a dummy substrate and both of the substrates are fixed with a low-temperature coagulant, the plurality of single-crystal semiconductor substrates are bonded to a support substrate; the temperature is raised up to a temperature, at which the low-temperature coagulant does not to have a bonding effect, so as to isolate the dummy substrate and the single-crystal semiconductor substrates; heat treatment is performed to separate part of the single-crystal semiconductor substrates, along a boundary of the respective separation layers; and single-crystal semiconductor layers are provided over the support substrate.

33 Claims, 11 Drawing Sheets

MANUFACTURING METHOD OF SEMICONDUCTOR SUBSTRATE AND SEMICONDUCTOR DEVICE

TECHNICAL FIELD

The present invention relates to manufacturing methods of a semiconductor substrate. In particular, the present invention relates to manufacturing methods of a semiconductor substrate in which a single-crystal semiconductor layer is bonded to a substrate which has an insulating surface, such as a glass substrate. Further, the present invention relates to semiconductor devices which have circuits including thin film transistors (hereinafter referred to as TFTs), using the semiconductor substrate. For example, the present invention relates to electro-optical devices typified by liquid crystal display panels, or electronic devices on which light-emitting display devices having an organic light-emitting element are mounted as components.

Note that semiconductor devices refer to all types of devices that can function by utilization of semiconductor characteristics in this specification. Electro-optical devices, semiconductor circuits, and electronic devices are included in the category of all semiconductor devices.

BACKGROUND ART

In recent years, attention has focused on a technique for making a thin film transistor (TFT) with the use of a semiconductor thin film (having a thickness of approximately several to several hundreds of nanometers) formed over a substrate having an insulating surface. The thin film transistors are widely applied to electronic devices such as ICs and electro-optical devices, and their rapid development as switching elements for image display devices has been particularly desired.

In order to obtain high-definition image display, a high-definition photolithography technique for arranging switching elements of an image display device with high area efficiency has been required. A large one-shot exposure apparatus, a stepper exposure apparatus, or the like is used in order to form switching elements over a large-area substrate with high precision.

Although a large one-shot exposure apparatus can expose a large area to light at a time, there is a problem in that variation in illuminance intensity or degree of parallelization is large. Accordingly, a stepper exposure apparatus which uses an optical system has often been used.

A region which is exposed to light at a time with the stepper exposure apparatus is limited. When light exposure is performed on an area which is larger than that region, several shots of light exposure are needed.

As an alternative to a silicon wafer which is manufactured by thinly slicing an ingot of a single-crystal semiconductor, a semiconductor substrate which is referred to as a silicon-on-insulator (SOI substrate) in which a thin single-crystal semiconductor layer is provided over an insulating layer has been developed. SOI substrate has been spread as substrates in manufacturing microprocessors or the like. The SOI substrate has been attracting attention because, when transistors that constitute part of an integrated circuit are formed using an SOI substrate, it is possible to reduce parasitic capacitance between drains of the transistors and the substrate, make the integrated circuit have higher performance, and achieve low power consumption.

As a method for manufacturing SOI substrates, a hydrogen ion implantation separation method using an ion implantation apparatus is known (for example, see Patent Document 1: U.S. Pat. No. 6,372,609). The hydrogen ion implantation separation method using an ion implantation apparatus is a method by which hydrogen ions are implanted into a silicon wafer to form a microbubble layer at a predetermined depth from the surface, and a thin silicon layer (SOI layer) is bonded to another silicon wafer using the microbubble layer as a cleavage plane. In addition to heat treatment for separating an SOI layer, it is necessary to perform heat treatment in an oxidizing atmosphere to form an oxide film on the SOI layer, remove the oxide film, and perform heat treatment at 1000° C. to 1300° C. in a reducing atmosphere to increase bonding strength.

On the other hand, attempts have been made to form an SOI layer on an insulating substrate such as glass. As an example of SOI substrates in which SOI layers are formed over glass substrates, an SOI substrate in which a thin single-crystal silicon layer is formed over a glass substrate having a coating film by a hydrogen ion implantation separation method using an ion implantation apparatus is known (see Patent Document 2: U.S. Pat. No. 7,119,365). In this case also, a thin silicon layer (SOI layer) is formed over the glass substrate in such a way that a microbubble layer is formed at a predetermined depth from the surface by implantation of hydrogen ions to a single-crystal silicon wafer, the glass substrate and the single-crystalline silicon wafer are bonded, and the silicon wafer is separated using the microbubble layer as a cleavage plane.

DISCLOSURE OF INVENTION

In order to separate a single-crystal silicon layer on a surface layer of a silicon wafer by a hydrogen ion implantation separation method using an ion implantation apparatus in order to obtain a single-crystal silicon layer, heat treatment at a high temperature of greater than or equal to 900° C. has been required. However, in the case of using a glass substrate that is used in a liquid crystal panel or the like for cost reduction of the substrate, as a support substrate, and bonding a single-crystal silicon layer to the glass substrate to form an SOI substrate, there has been a problem in that heat treatment at such a high temperature causes warpage of the glass substrate. When the glass substrate warps, bonding strength between the glass substrate and the single-crystal silicon layer decreases. In addition, there is also a problem in that strain stress is applied to the single-crystal silicon layer and characteristics of the transistor are adversely affected. In other words, even when a single-crystal silicon layer is disposed over a glass substrate and a transistor is manufactured using the single-crystal silicon layer, sufficient characteristics cannot be obtained with the conventional technique.

In addition, the shape of a glass substrate is rectangular and the size thereof is increased from 300×400 mm of the first generation in the early 1990s to 680×880 mm or 730×920 mm of the fourth generation in 2000.

In contrast, the wafer size of a semiconductor substrate is limited because a semiconductor substrate is manufactured by forming an ingot of 20 to 30 cm in diameter by a Czochralski method (a CZ method), and slicing the ingot with a diamond blade or the like so that the slice has a thickness of approximately 0.5 to 1.5 mm to make a circle wafer.

Accordingly, in the case of manufacturing an active matrix display device, using a glass substrate which is larger than a semiconductor substrate, a plurality of semiconductor substrates are used for a single glass substrate. In this case, however, it has been difficult to arrange the plurality of semiconductor substrates over the glass substrate with accurate alignment.

In view of the above-described problems, in the present invention, the following are performed in order to provide a single-crystal silicon layer over a large-sized glass substrate in a large area. After a plurality of rectangular single-crystal semiconductor substrates each provided with a separation layer are aligned over a dummy substrate and are temporarily fixed to the dummy substrate with a low-temperature coagulant, the plurality of single-crystal semiconductor substrates are bonded to a glass substrate which is a support substrate; the temperature is raised up to a temperature, at which the low-temperature coagulant does not have a bonding effect, so as to isolate the dummy substrate and the single-crystal semiconductor substrates; heat treatment is performed to separate part of the single-crystal semiconductor substrates, along a boundary of the respective separation layers; and single-crystal semiconductor layers are provided over the glass substrate.

With the use of a single mother glass substrate and a plurality of semiconductor substrates, it is possible to manufacture a display portion having an area larger than that of the semiconductor substrate and perform mass production of a semiconductor device having the display portion.

BEST MODE FOR CARRYING OUT THE INVENTION

Embodiment Mode

Embodiment modes of the present invention will be described hereinafter with reference to the drawings.

Embodiment Mode 1

This embodiment mode will hereinafter describe a method for manufacturing a semiconductor substrate (an SOI substrate) in which a single-crystal semiconductor layer is provided over an insulating substrate.

Figure 1A:
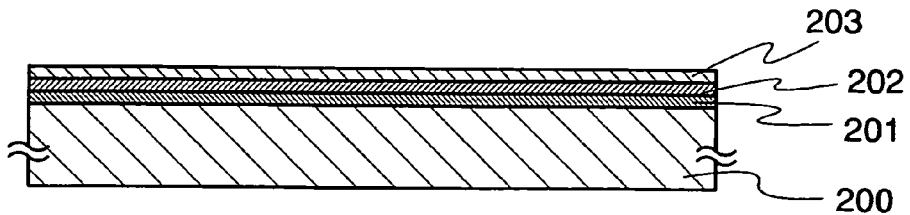
FIGS. 1A to 1D are cross-sectional views illustrating a method for manufacturing an SOI substrate in Embodiment Mode 1 of the present invention.

FIGS. 1A to 1D and FIGS. 2A to 2D each illustrate a method for manufacturing an SOI substrate in this embodiment mode. First, as illustrated in FIG. 1A, a silicon oxynitride layer 201 is formed over a semiconductor substrate 200 which is a 5-inch silicon wafer, for example. The thickness of the silicon oxynitride layer 201 may be set as appropriate by a practitioner and may be 10 to 500 nm (preferably 10 to 150 nm). The silicon oxynitride layer 201 will function as part of insulating layers which are provided for an SOI substrate. Note that the silicon oxynitride layer 201 can be formed by a CVD method such as a plasma CVD method or a low pressure CVD method, a sputtering method, or the like. When a single-crystal silicon substrate is used as the semiconductor substrate 200, treatment is performed on a surface of the single-crystal silicon substrate with oxygen radicals (there is also a case where an OH radical is included) which are generated by plasma discharge in a gas atmosphere containing oxygen and treatment is performed on the surface of the single-crystal silicon substrate with nitrogen radicals (there is also a case where an NH radical is included) which are generated by plasma discharge in a gas atmosphere containing nitrogen. Accordingly, the silicon oxynitride layer 201 can be formed over the semiconductor substrate 200. The silicon oxynitride layer 201 is provided, so that bonding strength can be increased in bonding the single-crystal silicon substrate and a support substrate later. Note that when there is no problem in bonding strength, the silicon oxynitride layer 201 is not necessarily provided.

Then, a silicon nitride oxide layer 202 is formed over the silicon oxynitride layer 201. Accordingly, when the support substrate is a glass substrate or the like, impurities from the support substrate, such as Na, can be prevented from being mixed in a semiconductor layer or the like. The thickness of the silicon nitride oxide layer 202 may be set as appropriate by a practitioner and may be 10 to 500 nm (preferably 10 to 200 nm). The silicon nitride oxide layer 202 will also function as part of insulating layers which are provided for an SOI substrate. Note that the silicon nitride oxide layer 202 can be formed by a CVD method such as a plasma CVD method or a low pressure CVD method, a sputtering method, or the like. The silicon oxynitride layer 201 and the silicon nitride oxide layer 202 are preferably stacked successively without being exposed to the atmosphere in order to prevent impurities from being mixed therein. The silicon nitride oxide layer 202 may be provided as appropriate, as needed, and is not necessarily provided. Further, although an example of forming the silicon nitride oxide layer 202 over the silicon oxynitride layer 201 is shown, the stacking order may be reversed. Furthermore, a silicon nitride layer may be provided between the silicon oxynitride layer 201 and the silicon nitride oxide layer 202.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 atomic %, 0.5 to 15 atomic %, 25 to 35 atomic %, and 0.1 to 10 atomic %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 to 30 atomic %, 20 to 55 atomic %, 25 to 35 atomic %, and 10 to 30 atomic %, respectively. Note that percentages of nitrogen, oxygen, silicon, and hydrogen fall within the ranges given above, where the total number of atoms contained in the silicon oxynitride layer or the silicon nitride oxide layer is defined as 100 atomic %.

Then, a first bonding layer 203 is formed over the silicon nitride oxide layer 202. A silicon oxide layer is suitable for the first bonding layer 203. In particular, a silicon oxide layer which is formed by a chemical vapor deposition method, using an organic silane gas, is preferable. Examples of an organic silane gas that can be used include silicon-containing compounds such as tetraethoxysilane, tetramethylsilane, tetramethylcyclotetrasiloxane, octamethylcyclotetrasiloxane, hexamethyldisilazane, triethoxysilane, or trisdimethylaminosilane. Alternatively, when a single-crystal semiconductor substrate is used as the semiconductor substrate 200, a thermal oxide layer formed through heat treatment at high temperature on the single-crystal semiconductor substrate or chemical oxide can be used for the first bonding layer 203. For example, chemical oxide can be formed by treating the surface of the single-crystal semiconductor substrate with ozone water. Chemical oxide is formed to reflect flatness of the surface of the single-crystal semiconductor substrate, which is preferable because chemical oxide is also flat when the single-crystal semiconductor substrate is flat.

The first bonding layer 203 has a surface which is smooth and activated. The first bonding layer 203 is provided with a thickness of 1 to 600 nm, preferably 5 to 500 nm, more preferably 5 to 200 nm. With such a thickness, it is possible to smooth surface roughness of a surface on which the first bonding layer 203 is formed and also to ensure smoothness of a surface of the first bonding layer 203. In addition, the first bonding layer 203 is provided, so that distortion between the support substrate and a single-crystal semiconductor layer (an SOI layer) which are bonded to each other can be eased. In bonding the SOI layer to a substrate having an insulating property or the support substrate which is a substrate having an insulating surface in a later step, the support substrate and the SOI layer can be strongly bonded together by providing the first bonding layer 203 which is formed of a silicon oxide layer, preferably, a thermal oxide layer; a silicon oxide layer formed by treating the surface of the single-crystal semiconductor substrate, which is used as the semiconductor substrate 200, with ozone water; or a silicon oxide layer formed using organic silane as a raw material, for either one or both bonding surfaces of the support substrate and the SOI layer. Note that when there is no problem in bonding strength, the first bonding layer 203 is not necessarily provided.

Figure 1B:
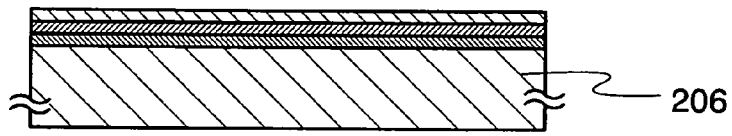

Then, as illustrated in FIG. 1B, the semiconductor substrate 200, the silicon oxynitride layer 201, the silicon nitride oxide layer 202, and the first bonding layer 203 are ground or cut. The semiconductor substrate 200 is ground or cut, thereby being processed into a rectangular shape to provide a sheet 206. Note that a rectangular shape includes a square and a rectangle, unless otherwise specified. While this embodiment mode describes an example in which the semiconductor substrate 200 is processed into a rectangular shape after the first bonding layer 203 is formed, the present invention is not limited thereto. The semiconductor substrate 200 may be processed into a rectangular shape before the silicon oxynitride layer 201 is formed. Alternatively, the semiconductor substrate 200 may be processed into a rectangular shape before the first bonding layer 203 is formed.

In specific, in order to process the semiconductor substrate into a rectangular shape, using a grinding apparatus or a dicing apparatus which includes a diamond wheel or a metal wheel, the semiconductor substrate is ground to provide the rectangle sheet 206. For example, when the 5-inch wafer is processed into a rectangular shape to provide the sheet 206, a rectangle with a 5-inch diagonal line can be the largest area. It is preferable that the area of the rectangular sheet be almost the same as a light-exposure area of one shot of a stepper exposure apparatus.

Then, an object to be irradiated is irradiated with ions that are accelerated by an electric field so that ions reach a predetermined depth from the surface of the object with an ion doping apparatus; thus, a separation layer is formed. The separation layer is formed by irradiation with ions of hydrogen, helium, or a halogen typified by fluorine. It is preferable that a surface of the first bonding layer 203 be sufficiently cleaned before the separation layer is formed.

Figure 1C:
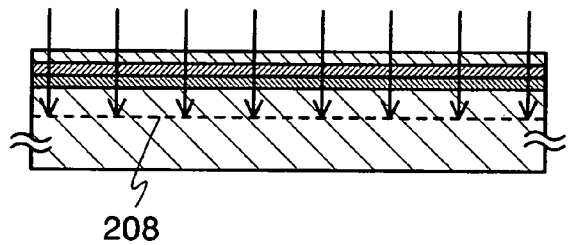

In this embodiment mode, the rectangular sheet 206 is irradiated with hydrogen ions to form a separation layer 208, which is a hydrogen-containing layer, as illustrated in FIG. 1C. In the case of irradiating the rectangular sheet 206 with hydrogen ions, it is preferable to include $H^+$, $H_2^+$, and $H_3^+$ ions in ions, with which irradiation is performed, and further to contain $H_3^+$ ions at a high proportion. With a high proportion of $H_3^+$ ions, implantation efficiency of hydrogen by irradiation with hydrogen ions can be increased and irradiation time can be shortened. Such a process facilitates separation along a separation layer which will be later performed.

In irradiating the rectangular sheet 206 with ions, irradiation with ions is performed at a high dose; therefore, there are cases where the surface of the rectangular sheet 206 is roughened. Accordingly, a surface which is irradiated with ions is preferably provided with a protective layer for ion irradiation with a thickness of 50 to 200 nm so that the surface can be prevented from being damaged and from losing its flatness due to ion irradiation using an ion doping apparatus. Note that the silicon oxynitride layer and the silicon nitride oxide layer each function as a protective layer in this embodiment mode.

Figure 1D:
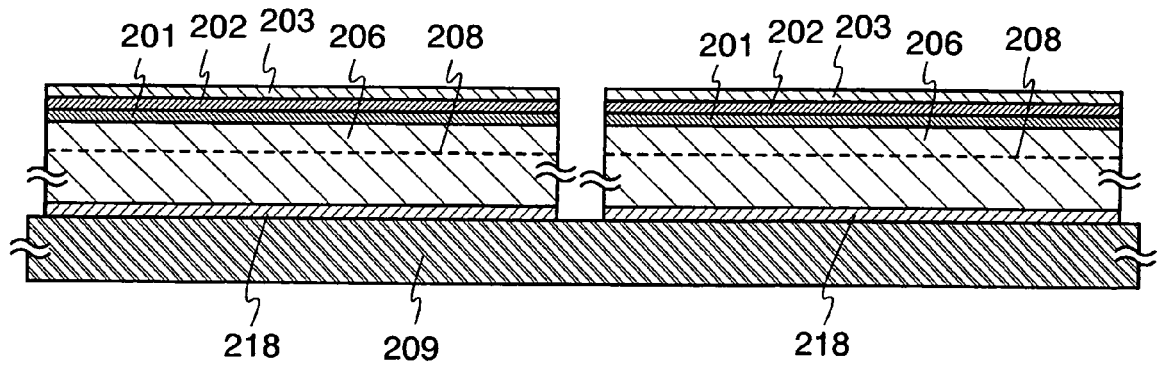

Then, as illustrated in FIG. 1D, the plurality of rectangular sheets 206 are arranged over a dummy substrate 209, each using a low-temperature coagulant 218, to be fixed to each other. In this embodiment mode, MW-1 (manufactured by Eminent Supply Corporation) is used as the low-temperature coagulant 218. The coagulation point of MW-1 is approximately at 17° C., and MW-1 has a bonding effect at a temperature less than or equal to the coagulation point (preferably at 10° C. or less) and does not have a bonding effect at a temperature greater than or equal to the coagulation point (preferably approximately 25° C. or more).

FIG. 1D illustrates a cross section which shows a process in which two sheets are arranged over the dummy substrate 209 to be fixed to each other. At that time, first, the low-temperature coagulant 218 is applied to a side opposite to a side, on which the first bonding layers 203 of the plurality of rectangular sheets 206 are formed, at a temperature at which the low-temperature coagulant 218 does not have a bonding effect (for example, approximately at 25° C. or more). The plurality of rectangular sheets 206 are arranged in matrix over the dummy substrate 209 with a predetermined interval (for example, greater than or equal to 0.01 mm and less than or equal to 1 mm), with the side facing downward. Since the low-temperature coagulant 218 does not have a bonding effect in this case, alignment can be performed easily. When the arrangement of the plurality of rectangular sheets 206 is determined, the temperature is lowered up to a temperature, at which the low-temperature coagulant 218 has a bonding effect (for example, approximately at 5° C.), so as to fix the plurality of rectangular sheets 206 over the dummy substrate 209. Note that the low-temperature coagulant 218 may be applied to the surface of the dummy substrate 209.

Figure 2A:
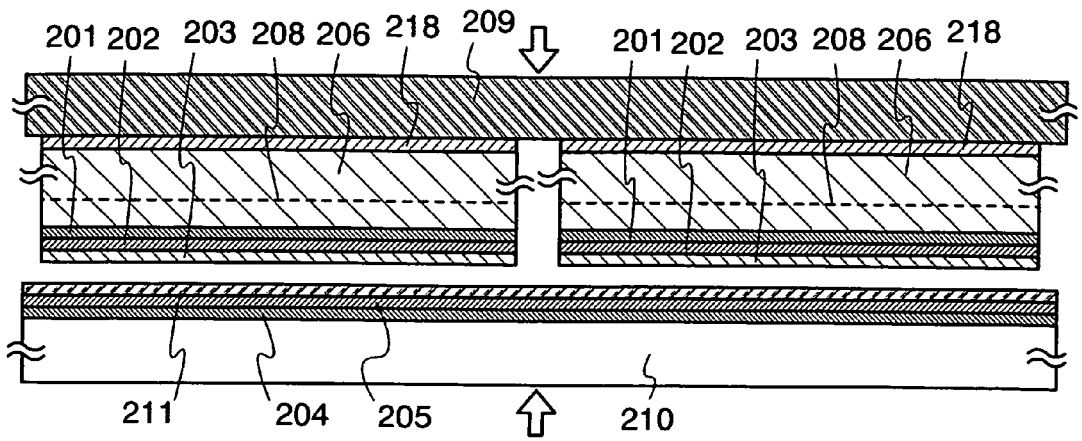
FIGS. 2A to 2D are cross-sectional views illustrating a method for manufacturing an SOI substrate in Embodiment Mode 1 of the present invention.

Then, as illustrated in FIG. 2A, the plurality of rectangular sheets 206 which are fixed over the dummy substrate 209 are disposed in close contact with a support substrate 210. FIG. 2A illustrates a cross section before two sheets are disposed in close contact with the support substrate 210. This step is also performed at a temperature at which the low-temperature coagulant 218 has a bonding effect (for example, approximately at 5° C.). The support substrate 210 is a substrate having an insulating property or a substrate having an insulating surface, and a glass substrate used for electronics industry, using aluminosilicate glass, aluminoborosilicate glass, or barium borosilicate glass, (also referred to as a "non-alkali glass substrate") can be used. In other words, a glass substrate having a coefficient of thermal expansion of from $25\times10^{-7}/°$ C. to $50\times10^{-7}/°$ C. (preferably from $30\times10^{-7}/°$ C. to $40\times10^{-7}/°$ C.) and a strain point of from 580 to 680° C. (preferably from 600 to 680° C.) can be used. In this embodiment mode, a 600×720 mm sized glass substrate can be used as the support substrate 210, for example.

As illustrated in FIG. 2A, a silicon oxynitride layer 204 is formed over the support substrate 210. The thickness of the silicon oxynitride layer 204 may be set as appropriate by a practitioner and may be 10 to 500 nm (preferably 10 to 150 nm). The silicon oxynitride layer 204 will function as part of insulating layers which are provided for an SOI substrate. Note that the silicon oxynitride layer 204 can be formed by a CVD method such as a plasma CVD method or a low pressure CVD method, a sputtering method, or the like. The silicon oxynitride layer 204 is provided, so that bonding strength in bonding the support substrate and the semiconductor substrate later can be increased. Note that when there is no problem in bonding strength, the silicon oxynitride layer 204 is not necessarily provided.

Then, a silicon nitride oxide layer 205 is formed over the silicon oxynitride layer 204. Accordingly, when the support substrate is a glass substrate or the like, impurities from the support substrate, such as Na, can be prevented from being mixed in a semiconductor layer or the like. The thickness of the silicon nitride oxide layer 205 may be set as appropriate by a practitioner and may be 10 to 500 nm (preferably 10 to 200 nm). The silicon nitride oxide layer 205 will also function as part of insulating layers which are provided in an SOI substrate. Note that the silicon nitride oxide layer 205 can be formed by a CVD method such as a plasma CVD method or a low pressure CVD method, a sputtering method, or the like. The silicon oxynitride layer 204 and the silicon nitride oxide layer 205 are preferably stacked successively without being exposed to the atmosphere in order to prevent impurities from being mixed therein. The silicon nitride oxide layer 205 may be provided, as needed, and is not necessarily provided. Further, although an example of forming the silicon nitride oxide layer 205 over the silicon oxynitride layer 204, the stacking order may be reversed. Furthermore, a silicon nitride layer may be provided between the silicon oxynitride layer 204 and the silicon nitride oxide layer 205.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 atomic %, 0.5 to 15 atomic %, 25 to 35 atomic %, and 0.1 to 10 atomic %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 to 30 atomic %, 20 to 55 atomic %, 25 to 35 atomic %, and 10 to 30 atomic %, respectively. Note that percentages of nitrogen, oxygen, silicon, and hydrogen fall within the ranges given above, where the total number of atoms contained in the silicon oxynitride layer or the silicon nitride oxide layer is defined as 100 atomic %.

In order to increase the bonding strength, a second bonding layer 211 may be formed over the silicon nitride oxide layer 205. Further, each of surfaces which are disposed in close contact is preferably cleaned enough to increase the bonding strength.

Next, after the sheets 206 are arranged over the support substrate 210, the sheets 206 and the support substrate 210 are bonded to each other. First, when the sheets 206 and the support substrate 210 face to each other so as to slightly press at least one part thereof from the outside, the distance between the surfaces, which are disposed in close contact with each other, is locally reduced. Accordingly, van der Waals force is increased, and further the sheets 206 and the support substrate 210 attract each other so that they are bonded also due to influence of hydrogen bonding. Further, since the distance between the surfaces, which are disposed in close contact with each other in an adjacent region, is also reduced, van der Waals force is increased, and the sheets 206 and the support substrate 210 are bonded due to influence of hydrogen bonding. In this manner, a region in which van der Waals force strongly acts or a region which is influenced by hydrogen bonding is widened, so that the bonding proceeds and a bonded region spreads to the entire surfaces which are disposed in close contact with each other. Pressing is performed so that pressure is applied perpendicular to the surfaces which are disposed in close contact with each other, in consideration of the pressure resistance of the support substrate 210 and the sheets 206.

Further, in order to form a favorable bond, the surfaces which are disposed in close contact with each other are preferably activated. For example, the surfaces which are disposed in close contact with each other are irradiated with an atomic beam or an ion beam. In the case of irradiating the surfaces which are disposed in contact with each other with an atomic beam or an ion beam, an inert gas neutral atom beam or an inert gas ion beam of argon or the like can be used. Further, plasma irradiation or radical treatment is performed. Alternatively, at least one of the surfaces of the support substrate 210 and the sheets 206 may be treated with oxygen plasma or washed with ozone water to be hydrophilic. Such a surface treatment facilitates bonding between different kinds of materials even at a temperature of lower than 400° C.

Figure 2B:
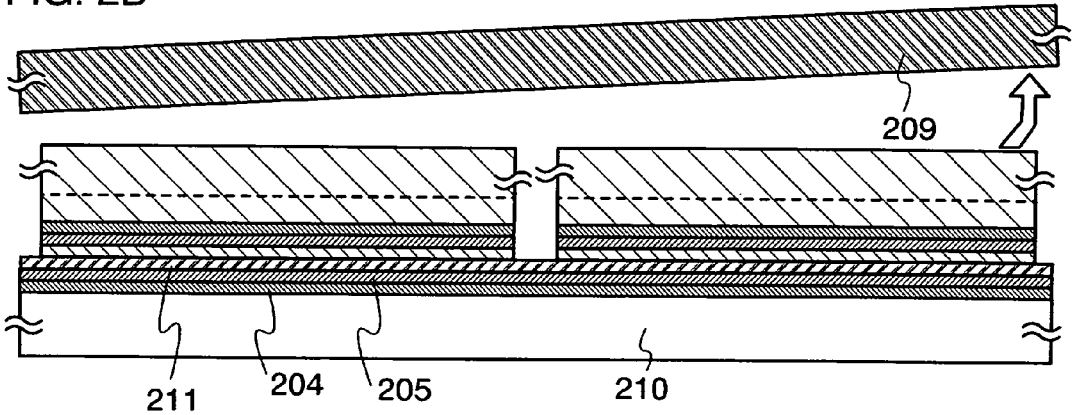

Next, as illustrated in FIG. 2B, the temperature is raised up to a temperature, at which the low-temperature coagulant 218 does not have a bonding effect (for example, approximately at 25° C. or more), so as to isolate the dummy substrate 209 from the sheets 206 and so as to remove the low-temperature coagulant 218 by volatilization thereof. Note that the low-temperature coagulant 218 may be removed by washing.

Next, heat treatment is performed. For example, after heat treatment is performed at 200° C. for 2 hours, another heat treatment is performed at 650° C. for 2 hours. Here, a change in volume of fine voids in the separation layer 208 occurs by this heat treatment. Accordingly, distortion occurs in the separation layer, so that the sheets 206, which are semiconductor substrates, become partially fragile along the separation layers 208. As heat treatment, heat treatment using a furnace or heat treatment with laser beam irradiation can be performed. In the case of performing heat treatment with laser beam irradiation, the sheets 206 can be heated through the support substrate. In addition, damage by hydrogen ion irradiation can be recovered with laser beam irradiation.

As for a laser beam, a gas laser typified by an excimer laser or a solid state laser typified by a YAG laser can be used as a light source. A wavelength of the laser beam is preferably in the range from ultraviolet wavelength to near-infrared light wavelength, and a wavelength of 190 to 1600 nm is employed. The laser beam emitted from the light source is preferably converged by an optical system to be processed into a rectangular or linear shape, and irradiation may be performed by scanning the laser beam on a surface to be irradiated. Alternatively, flash lamp annealing which is performed using a halogen lamp, a xenon lamp, or the like may be employed for a similar object.

Figure 2C:
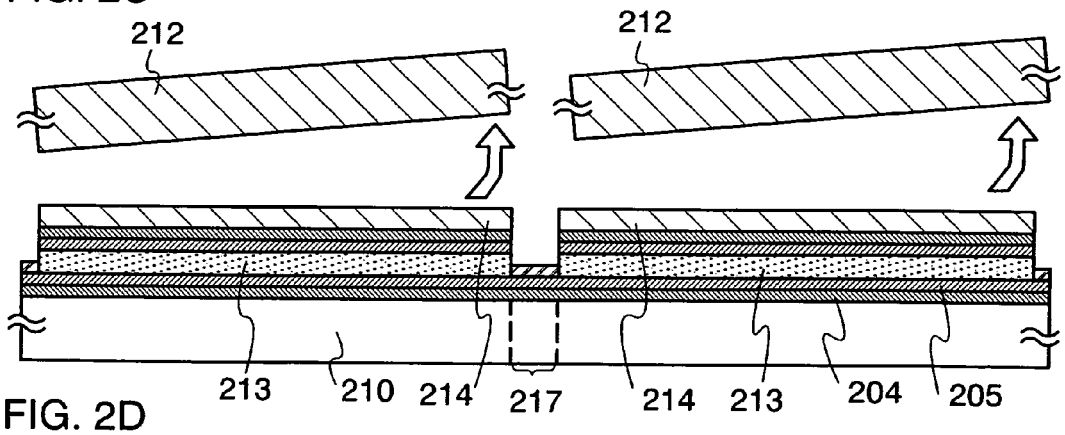

As illustrated in FIG. 2C, part 212 of the semiconductor substrates are separated from the support substrate 210 with the above-described heat treatment, along a boundary (also referred to as a cleavage plane) inside the separation layer or at the top interface or bottom interface of the separation layer 208. In this manner, rectangular sheet-like stacks of a third bonding layer 213, the silicon nitride oxide layer 202, the silicon oxynitride layer 201, and a single-crystal semiconductor layer 214 are formed in that order over the support substrate 210 at a predetermined interval 217. The interval 217 is preferably greater than or equal to 0.01 mm and less than or equal to 1 mm. The single-crystal semiconductor layer 214 can also be referred to as an SOI layer. In addition, the support substrate having the SOI layer can be referred to as an SOI substrate. Note that a region in which the first bonding layer 203 and the second bonding layer 211 are disposed in close contact to be bonded to each other is referred to as the third bonding layer 213.

Note that before the part 212 of the semiconductor substrates are separated from the support substrate 210, along a boundary inside the separation layer or at the top interface or bottom interface of the separation layer, a trigger is preferably made so that separation can be performed easily. Specifically, treatment is performed by which bonding strength between the separation layer and the SOI layer is selectively (partially) lowered, so that separation defects are reduced and a yield is improved. As typical treatment, impact of local pressure is applied to the sheet 206, a groove is formed in the support substrate 210 towards the separation layer with a laser beam or a dicer, or a groove is formed in the sheet 206 towards the separation layer with a laser beam or a dicer.

After the SOI layers are formed over the support substrate as illustrated in FIG. 2C, chemical mechanical polishing (CMP) treatment is preferably performed as planarization treatment of surfaces of the SOI layers. Alternatively, the surfaces of the SOI layers may be irradiated with a laser beam without using the CMP treatment. Note that laser beam irradiation is preferably performed in a nitrogen atmosphere with an oxygen concentration of less than or equal to 10 ppm. This is because there is a concern that the surfaces of the SOI layers may be roughened when laser beam irradiation is performed in an oxygen atmosphere. Treatment such as CMP may be performed in order to thin the SOI layers which are obtained.

Figure 2D:
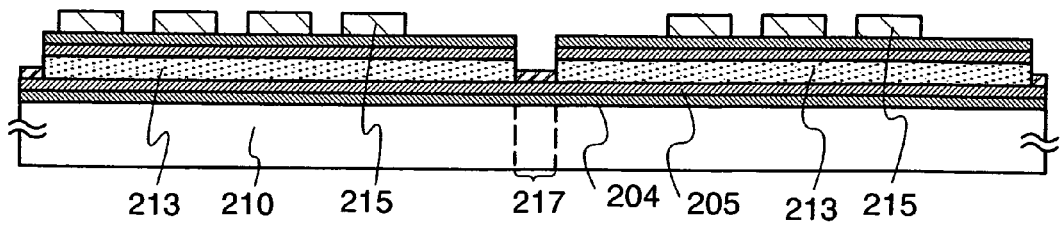

Lastly, the single-crystal semiconductor layers 214 are patterned using a normal photolithography technique as illustrated in FIG. 2D to form island-shaped semiconductor layers 215. Note that a photolithography technique refers to a technique in which a resist is formed, light exposure is performed using a photomask, development is performed, and then etching is selectively performed using an obtained resist mask. In this embodiment mode, one shot of light exposure can be performed per sheet, using a stepper exposure apparatus, for example.

In the following steps, a semiconductor device can be manufactured through a normal process, using the island-shaped semiconductor layers 215.

Figure 3:
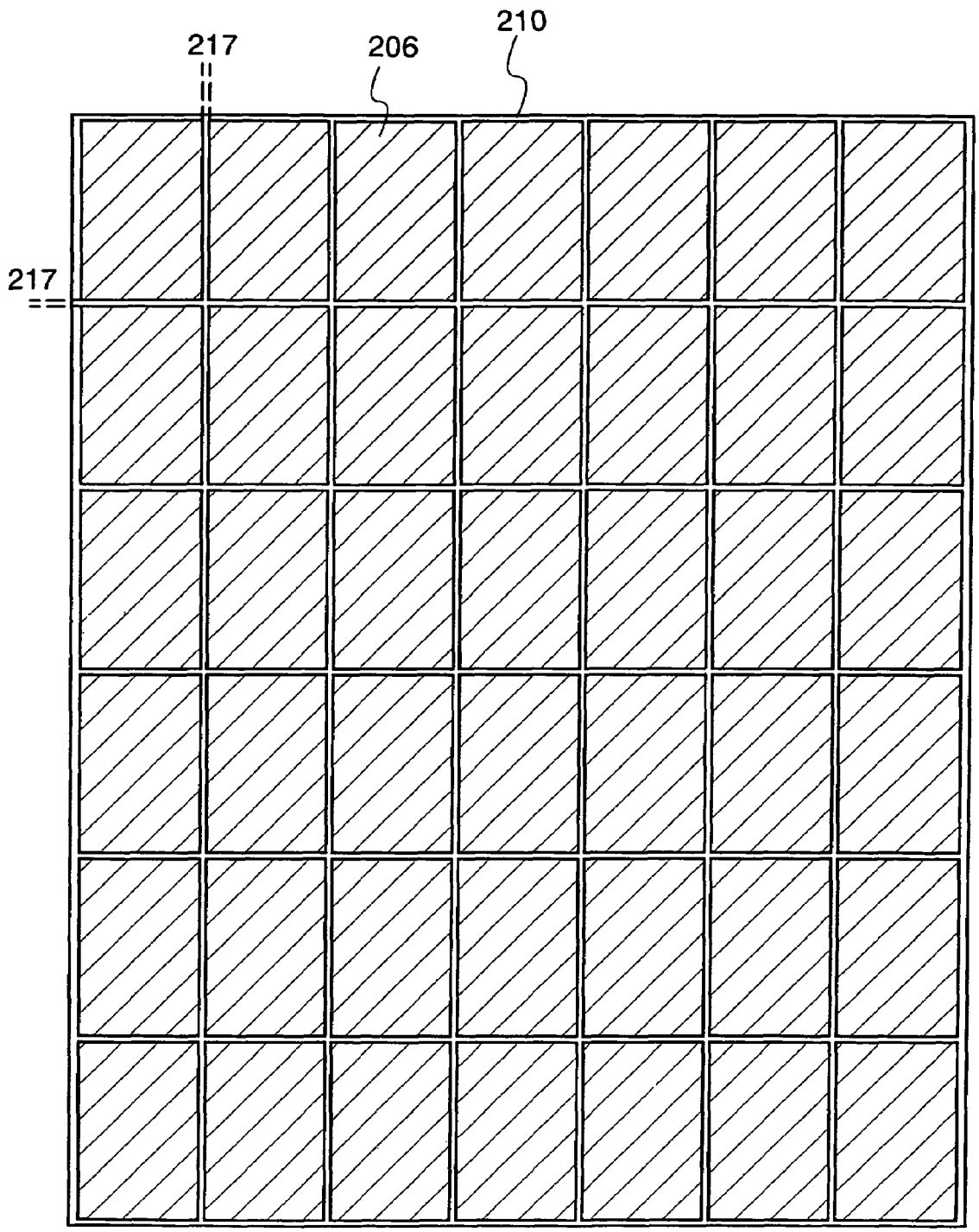
FIG. 3 is a view illustrating arrangement of sheets over a support substrate in Embodiment Mode 1 of the present invention.

Note that the size of the rectangular sheets 206 can be determined depending on its use, as appropriate. FIG. 3 illustrates arrangement of sheets over the support substrate. For example, in the case where a 730×920 mm sized glass substrate is used as the support substrate 210 and the SOI layers are provided thereover with the above-described method, the rectangular sheets 206, the number of which is 7×6, may be arranged with the size of the rectangular sheets 206 being 100×150 mm and the intervals 217 being approximately 1 mm, for example. In this case, the rectangular sheets can be cut off from an 8-inch silicon wafer, for example. In a similar case of a 680×880 mm sized glass substrate, rectangular sheets, the number of which is 6×7, may be arranged with the size of the rectangular sheets 206 being 100×120 mm and intervals being approximately 1 mm.

In order to obtain 5×5 inch sized rectangular sheets, the rectangular sheets may be cut off from a 6-inch wafer or an 8-inch wafer. Note that in the case of being cut off from an 8-inch wafer, the rectangular sheets has four angular corners; however, in the case of being cut off from a 6-inch wafer, the rectangular sheets has four round corners without being angular because of slight lack of the wafer size.

Here, an example of an apparatus which is used in the following steps is described with reference to FIGS. 4A and 4B: the steps of fixing the rectangular sheets 206 after the formation of the separation layers 208 to the dummy substrate 209; bonding the rectangular sheets 206 to the support substrate 210; and forming the single-crystal semiconductor layer 214 over the support substrate 210.

Figure 4A:
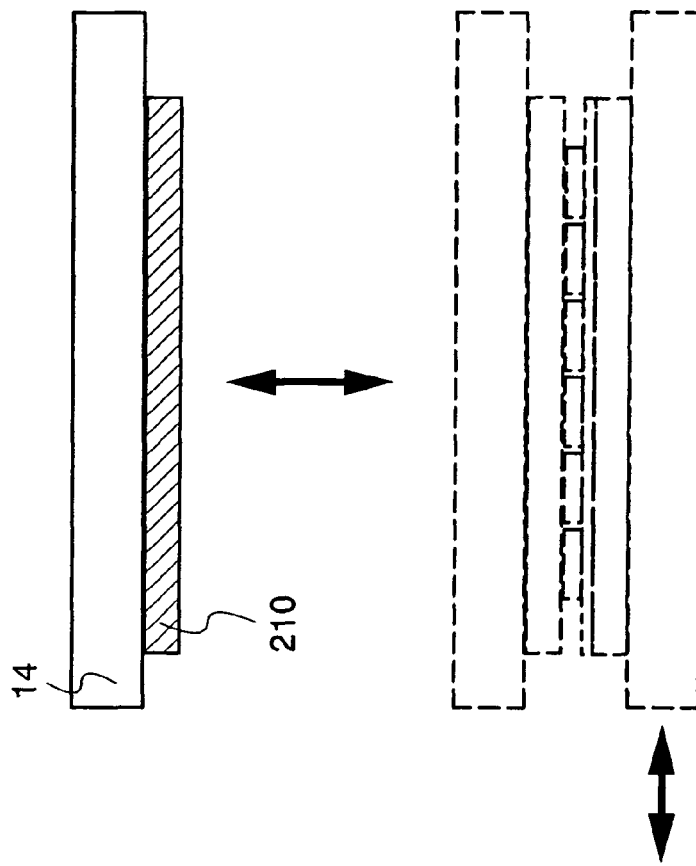
FIGS. 4A and 4B are views illustrating an apparatus and a process in Embodiment Mode 1 of the present invention.
Figure 4B:
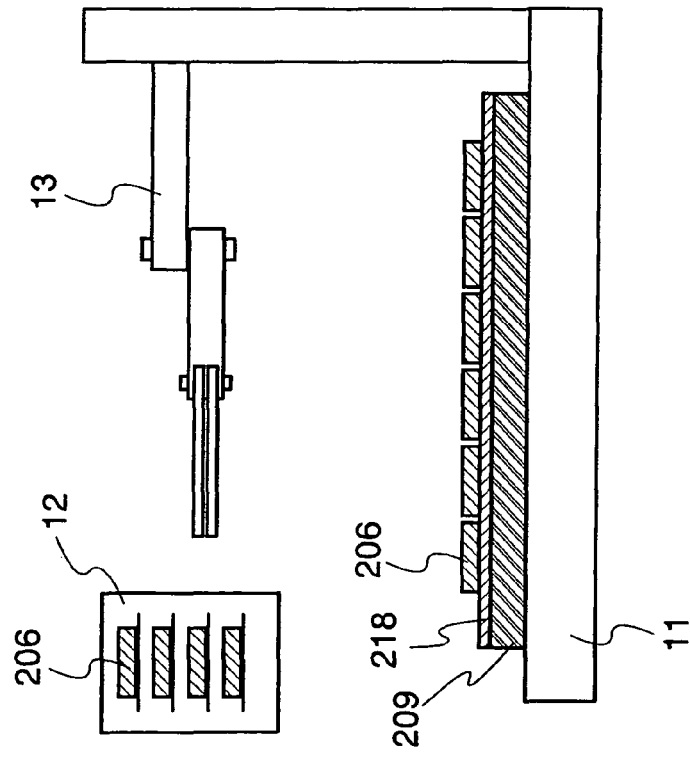

In FIG. 4A, the dummy substrate 209 is held in a dummy substrate holding unit 11, and the low-temperature coagulant 218 is applied to the top surface of the dummy substrate 209. At this time, application of the low-temperature coagulant 218 is performed at a temperature at which the low-temperature coagulant 218 does not have a bonding effect.

Subsequently, the rectangular sheets 206 (the sheets after the steps in FIGS. 1A to 1C) which are stored in a sheet storage unit 12 after the formation of the separation layers 208 are transferred by a sheet transfer unit 13 to be arranged in matrix over the dummy substrate 209 at desired intervals. This operation is performed at a temperature at which the low-temperature coagulant 218 does not have a bonding effect; therefore, alignment can be performed easily.

When arrangement of all of the sheets 206 is finished, the temperature is lowered up to a temperature at which the low-temperature coagulant 218 has a bonding effect. After the plurality of sheets 206 are fixed over the dummy substrate 209, the dummy substrate holding unit 11 is slid to move the sheets 206 under a support substrate holding unit 14.

The support substrate 210, on which necessary surface treatment is performed, is held in the support substrate holding unit 14. When the support substrate holding unit 14 moves downward, the sheets 206, which are formed over the dummy substrate 209, and the support substrate 210 are bonded to each other (FIG. 4B).

After that, with the bonding between the support substrate 210 and the sheets 206 over the dummy substrate 209 being held, the top and bottom are reversed so that the dummy substrate 209 comes on the top. In this state, the temperature is raised up to a temperature, at which the low-temperature coagulant 218 does not have a bonding effect, so as to isolate the dummy substrate 209. The low-temperature coagulant 218 is removed by volatilization thereof, or by being washed if necessary.

Lastly, the part 212 of the semiconductor substrates of the sheets are separated from the support substrate 210 with heat treatment, along a boundary inside the separation layer or at the top interface or bottom interface of the separation layer 208, so as to form the single-crystal semiconductor layers 214.

Through the above-described steps, alignment can be performed easily in arranging and forming a plurality of single-crystal semiconductor layers over a large-sized glass substrate which is a support substrate; therefore, mass production of an SOI substrate can be performed.

Embodiment Mode 2

This embodiment mode will describe hereinafter a method for manufacturing an SOI substrate which is different from the method in FIGS. 1A to 1D and FIGS. 2A to 2D.

Figure 5A:
FIGS. 5A to 5D are cross-sectional views illustrating a method for manufacturing an SOI substrate in Embodiment Mode 2 of the present invention.

FIGS. 5A to 5D and FIGS. 6A to 6D illustrate a method for manufacturing an SOI substrate in this embodiment mode. In FIG. 5A, a p-type or an n-type single-crystal silicon substrate (a silicon wafer) is typically used as a semiconductor substrate 400.

Then, the semiconductor substrate 400 is ground or cut, thereby being processed into a rectangular shape to provide a sheet 406.

Then, degreasing cleaning is performed on the sheet 406 and an oxide film on the surface is removed and then thermal oxidation is performed. As thermal oxidation, dry oxidation may be performed; however, thermal oxidation in an oxidation atmosphere to which halogen is added is preferably performed. For example, heat treatment is performed at a temperature of greater than or equal to 700° C. in an atmosphere containing HCl as a halogen gas at 0.5 to 10% by volume (preferably 3% by volume) with respect to oxygen. Preferably, thermal oxidation is performed at a temperature of 950 to 1100° C. The treatment time is 0.1 to 6 hours, preferably 0.5 to 1 hour. The oxide layer is formed with a thickness of 10 to 1000 nm, preferably 50 to 200 nm. The thickness is 100 nm in this embodiment mode.

As an alternative to HCl, one or more selected from HF, $NF_3$, HBr, $Cl_2$, $ClF_3$, $BCl_3$, $F_2$, $Br_2$, or dichloroethylene can be used as a halogen gas.

When heat treatment is performed at a temperature within the above-described temperature range, a gettering effect due to halogen with respect to the sheet 406 can be obtained. Gettering particularly has an effect of removing impurities such as metal. For example, when HCl is used as a halogen gas, impurities such as metal which are contained in the sheet 406 turn into a volatile chloride, moved into the air and removed by action of chlorine. Gettering by halogen is preferably effective if being performed on the semiconductor substrate 400 having its surface subjected to chemical mechanical polishing (CMP) treatment. Hydrogen has action of compensating defects at an interface between the sheet 406 and an oxide layer 401 so as to lower a localized-level density at the interface.

The oxide layer 401 which is formed through such heat treatment can contain halogen. When halogen is contained in the oxide layer 401 at a concentration of $1\times10^{17}$ atoms/cm$^3$ to $5\times10^{20}$ atoms/cm$^3$, halogen captures impurities such as metal; therefore, the oxide layer 401 can exhibit a function as a protective film which prevents contamination caused by impurities such as metal contained in the sheet 406.

Figure 5B:
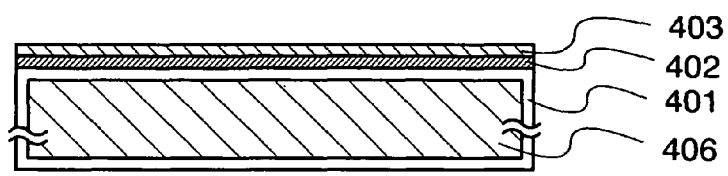

Then, a blocking layer 402 is formed over the oxide layer 401, as illustrated in FIG. 5B. As the blocking layer 402, a silicon nitride layer or a silicon nitride oxide layer is formed with a thickness of 50 to 200 nm by a vapor phase growth method. For example, a silicon nitride layer is formed by a plasma CVD method, using $SiH_4$ and $NH_3$ as a source gas. A silicon nitride oxide layer is formed by a plasma CVD method, using $SiH_4$, $N_2O$, and $NH_3$ as a source gas. The blocking layer 402 has an effect of preventing diffusion of impurities into single-crystal semiconductor layers 414 which will be later formed from the sheets 406. In addition, in forming a separation layer 408, the blocking layer 402 has an effect of preventing flatness from being lost due to damage to the surface of the sheet 406 which is caused by ion irradiation. Note that the blocking layer 402 may be provided, as needed, and is not necessarily provided.

Then, a first bonding layer 403 is formed over the blocking layer 402, as illustrated in FIG. 5B. A silicon oxide layer is preferably formed as the first bonding layer 403. The thickness of the silicon oxide layer is 10 to 200 nm, preferably 10 to 100 nm, and more preferably, 20 to 50 nm. As the silicon oxide layer, a silicon oxide layer which is formed by a chemical vapor deposition method using an organic silane gas is preferably used. Examples of an organic silane gas that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$). Alternatively, a silicon oxide layer which is formed by a chemical vapor deposition method using a silane gas can be used. Film formation by a chemical vapor deposition method is performed at a temperature, for example, less than or equal to 350° C., at which degassing of the separation layer 408 which will be later formed does not occur (a temperature at which the surface of the silicon oxide layer which is formed as the first bonding layer 403 is not roughed or a temperature at which a crack is not generated in the separation layer 408). In addition, when a single-crystal or polycrystalline semiconductor layer is used as the semiconductor substrate 400, heat treatment for separation of a single-crystal or polycrystalline semiconductor layer from the semiconductor substrate is performed at a temperature higher than a film formation temperature of the first bonding layer 403. Note that when bonding strength is sufficient, the first bonding layer 403 is not necessarily provided.

Figure 5C:
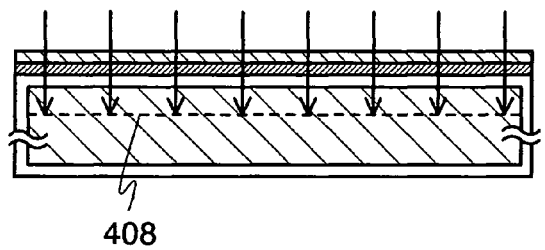

Then, as illustrated in FIG. 5C, the sheet 406 covered with the first bonding layer 403 is irradiated with ions that are accelerated by an electric field, so that the separation layer 408 is formed in a region at a predetermined depth from the surface of the sheet 406. Ion irradiation is preferably performed with an ion doping apparatus. That is, a doping apparatus, with which irradiation with ions generated by exciting a source gas into plasma is performed without mass separation, is used. As to an irradiation method with an ion doping apparatus, which is different from a method using an ion implantation apparatus with which dot sequential scanning is performed, the ion doping apparatus can perform irradiation on a large irradiation surface. Ion irradiation is performed with an accelerating voltage of 10 kV to 100 kV, preferably 30 to 80 kV; a dose of $1\times10^{16}$ ions/cm$^2$ to $4\times10^{16}$ ions/cm$^2$; and a beam current density of 2 μA/cm$^2$ or more, preferably 5 μA/cm$^2$ or more, and more preferably 10 μA/cm$^2$ or more. The ion irradiation can reduce defects generated in the single-crystal semiconductor layers.

Note that halogen is contained in the oxide layer 401 at a concentration of $1\times10^{17}$ atoms/cm$^3$ to $5\times10^{20}$ atoms/cm$^3$, and has a function of blocking impurities from being mixed in ion irradiation. In hydrogen ion irradiation, there is a concern that, along with hydrogen ions, heavy metal elements which originate from a material of an inner wall of a chamber or an electrode portion material may be added and a surface of the oxide layer 401 may be contaminated. In order to reduce the effect of the contaminated surface, the surface of the oxide layer 401 may be thinly removed by wet etching or dry etching. In addition, since the heavy metal elements which originate from a material of an inner wall of a chamber or an electrode portion material is contained in a region above a region of hydrogen ions, it is effective to form the oxide layer 401 containing halogen on the surface of the sheet 406. If heat treatment is performed after heavy metal elements are added to the oxide layer 401, halogen in the oxide layer 401 is reacted with the heavy metal elements, so that the heavy metal elements do not diffuse. When an oxide layer containing halogen is formed, improvement in electrical characteristics in a switching element using a single-crystal semiconductor layer, for example, reduction in off current, can be achieved.

Note that this embodiment mode describes an example in which the separation layer 408 is formed after the blocking layer 402 and the first bonding layer 403 are formed. However, without being particularly limited thereto, the present invention may employ a structure in which the blocking layer 402 and the first bonding layer 403 is formed after the separation layer 408 is formed. If such a process is employed, the blocking layer 402 and the first bonding layer 403 can be successively formed without being exposed to the atmosphere; accordingly, contamination by potassium, sodium, or the like or mixture of a foreign body can be prevented.

Further, an example in which the oxide layer 401 is formed after the semiconductor substrate 400 is processed into a rectangular shape to form the sheet 406 is described. However, without being particularly limited thereto, the present invention may employ a structure in which the semiconductor substrate 400 is processed into a rectangular shape after the oxide layer 401 is formed. Alternatively, the semiconductor substrate 400 may be processed into a rectangular shape before the blocking layer 402 is formed or the semiconductor substrate 400 may be processed into a rectangular shape before the first bonding layer 403 is formed.

Figure 5D:
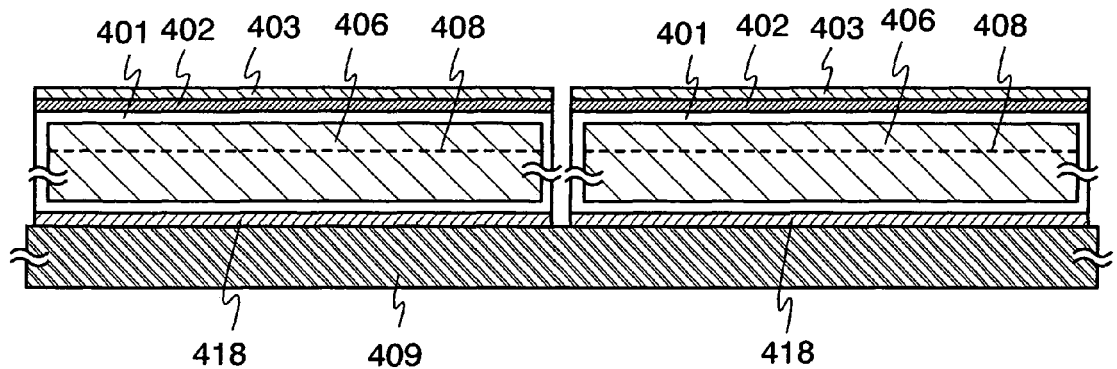

Then, as illustrated in FIG. 5D, the plurality of rectangular sheets 406 are arranged over a dummy substrate 409, each using a low-temperature coagulant 418, to be fixed to each other. In this embodiment mode, MW-1 (manufactured by Eminent Supply Corporation) is used as the low-temperature coagulant 418. The coagulation point of MW-1 is approximately at 17° C., and MW-1 has a bonding effect at a temperature less than or equal to the coagulation point (preferably at 10° C. or less) and does not have a bonding effect at a temperature greater than or equal to the coagulation point (preferably approximately 25° C. or more).

FIG. 5D illustrates a cross section which shows a process in which two sheets are arranged over the dummy substrate 409 to be fixed to each other. At this time, first, the low-temperature coagulant 418 is applied to a side opposite to a side, on which the first bonding layers 403 of the plurality of rectangular sheets 406 are formed, at a temperature at which the low-temperature coagulant 418 does not have a bonding effect (for example, approximately at 25° C. or more). The plurality of rectangular sheets 406 are arranged in matrix over the dummy substrate 409 with a predetermined interval (for example, greater than or equal to 0.01 mm and less than or equal to 1 mm), with the side facing downward. Since the low-temperature coagulant 418 does not have a bonding effect in this case, alignment can be performed easily. When the arrangement of the plurality of rectangular sheets 406 is determined, the temperature is lowered up to a temperature, at which the low-temperature coagulant 418 has a bonding effect (for example, approximately at 5° C.), so as to fix the plurality of rectangular sheets 406 over the dummy substrate 409. Note that the low-temperature coagulant 418 may be applied to the surface of the dummy substrate 409.

Figure 6A:
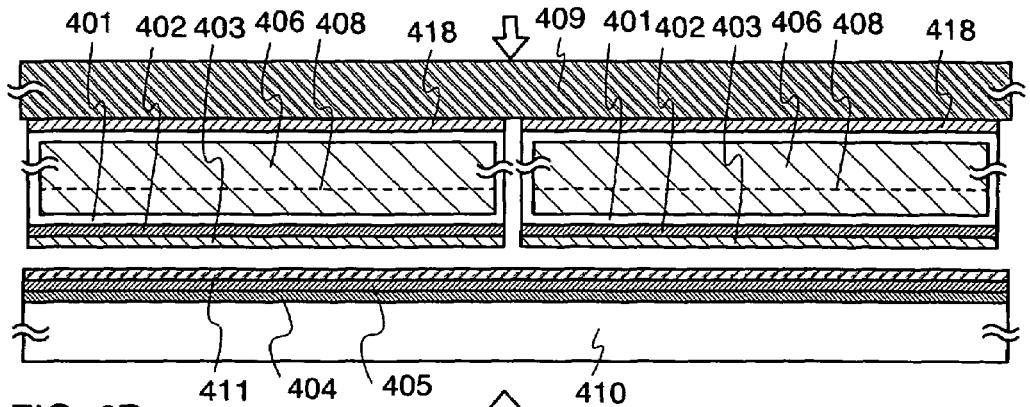
FIGS. 6A to 6D are cross-sectional views illustrating a method for manufacturing an SOI substrate in Embodiment Mode 2 of the present invention.

Then, as illustrated in FIG. 6A, the plurality of rectangular sheets 406 which are fixed over the dummy substrate 409 are disposed in close contact with a support substrate 410. FIG. 6A illustrates a cross section before two sheets are disposed in close contact with the support substrate 410. This step is also performed at a temperature at which the low-temperature coagulant 418 has a bonding effect (for example, approximately at 5° C.). The support substrate 410 is a substrate having an insulating property or a substrate having an insulating surface, and a glass substrate used for electronics industry, using aluminosilicate glass, aluminoborosilicate glass, or barium borosilicate glass, (also referred to as a "non-alkali glass substrate") can be used. In other words, a glass substrate having a coefficient of thermal expansion of from $25\times10^{-7}/°C$. to $50\times10^{-7}/°C$. (preferably from $30\times10^{-7}/°C$. to $40\times10^{-7}/°C$.) and a strain point of from 580 to 680° C. (preferably from 600 to 680° C.) can be used. In this embodiment mode, a 600×720 mm sized glass substrate can be used as the support substrate 410, for example.

As illustrated in FIG. 6A, a silicon oxynitride layer 404 is formed over the support substrate 410. The thickness of the silicon oxynitride layer 404 may be set as appropriate by a practitioner and may be 10 to 500 nm (preferably 10 to 150 nm). The silicon oxynitride layer 404 functions as part of insulating layers which are provided for an SOI substrate. Note that the silicon oxynitride layer 404 can be formed by a CVD method such as a plasma CVD method or a low pressure CVD method, a sputtering method, or the like. The silicon oxynitride layer 404 is provided, so that bonding strength in bonding the support substrate and a semiconductor substrate later can be increased. Note that when there is no problem in bonding strength, the silicon oxynitride layer 404 is not necessarily provided.

Then, a silicon nitride oxide layer 405 is formed over the silicon oxynitride layer 404. Accordingly, when the support substrate is a glass substrate or the like, impurities from the support substrate, such as Na, can be prevented from being mixed in a semiconductor layer or the like. The thickness of the silicon nitride oxide layer 405 may be set as appropriate by a practitioner and may be 10 to 500 nm (preferably 10 to 200 nm). The silicon nitride oxide layer 405 will also function as part of insulating layers which are provided in an SOI substrate. Note that the silicon nitride oxide layer 405 can be formed by a CVD method such as a plasma CVD method or a low pressure CVD method, a sputtering method, or the like. The silicon oxynitride layer 404 and the silicon nitride oxide layer 405 are preferably stacked successively without being exposed to the atmosphere in order to prevent impurities from being mixed therein. The silicon nitride oxide layer 405 may be provided as appropriate, as needed, and is not necessarily provided. Further, although an example of forming the silicon nitride oxide layer 405 over the silicon oxynitride layer 404, the stacking order may be reversed. Furthermore, a silicon nitride layer may be provided between the silicon oxynitride layer 404 and the silicon nitride oxide layer 405.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 atomic %, 0.5 to 15 atomic %, 25 to 35 atomic %, and 0.1 to 10 atomic %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 to 30 atomic %, 20 to 55 atomic %, 25 to 35 atomic %, and 10 to 30 atomic %, respectively. Note that percentages of nitrogen, oxygen, silicon, and hydrogen fall within the ranges given above, where the total number of atoms contained in the silicon oxynitride layer or the silicon nitride oxide layer is defined as 100 atomic %.

In order to increase the bonding strength, a second bonding layer 411 may be formed over the silicon nitride oxide layer 405. Further, each of surfaces which are disposed in close contact is preferably cleaned enough to increase the bonding strength.

Next, after the sheets 406 are arranged over the support substrate 410, the sheets 406 and the support substrate 410 are bonded to each other. First, when the sheets 406 and the support substrate 410 face to each other so that at least one part thereof is slightly pressed from the outside, the distance between the surfaces, which are disposed in close contact with each other, is locally reduced. Accordingly, van der Waals force is increased, and further the sheets 406 and the support substrate 410 attract each other so that they are bonded also due to influence of hydrogen bonding. Further, since the distance between the surfaces, which are disposed in close contact with each other in an adjacent region, is also reduced, van der Waals force is increased, and the sheets 406 and the support substrate 410 are bonded due to influence of hydrogen bonding. In this manner, a region in which van der Waals force strongly acts or a region which is influenced by hydrogen bonding is widened, so that the bonding proceeds and a bonded region spreads to the entire surfaces which are disposed in close contact with each other. Pressing is performed so that pressure is applied perpendicular to the surfaces which are disposed in close contact with each other, in consideration of the pressure resistance of the support substrate 410 and the sheets 406.

Further, in order to form a favorable bond, the surfaces which are disposed in close contact with each other are preferably activated. For example, the surfaces which are disposed in close contact with each other are irradiated with an atomic beam or an ion beam. In the case of irradiating the surfaces which are disposed in contact with each other with an atomic beam or an ion beam, an inert gas neutral atom beam or inert gas ion beam of argon or the like can be used. Further, plasma irradiation or radical treatment is performed. Alternatively, at least one of the surfaces of the support substrate 410 and the sheets 406 may be treated with oxygen plasma or washed with ozone water to be hydrophilic. Such a surface treatment facilitates bonding between different kinds of materials even at a temperature of lower than 400° C.

Figure 6B:
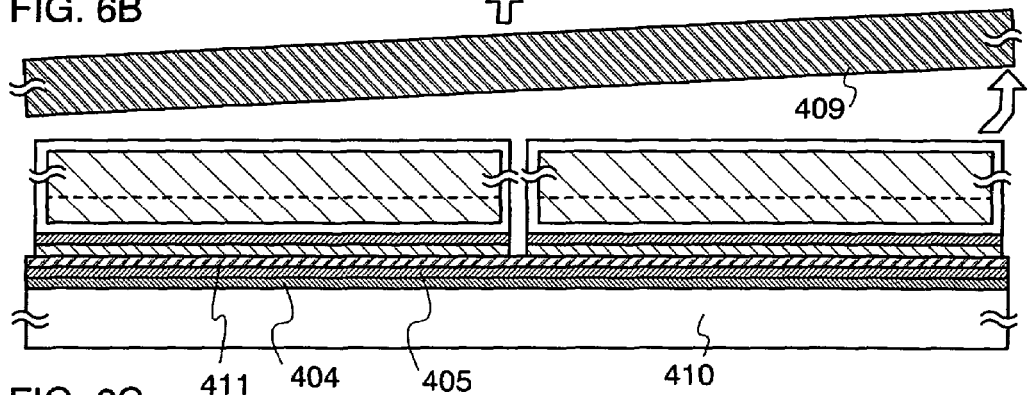

Next, as illustrated in FIG. 6B, the temperature is raised up to a temperature, at which the low-temperature coagulant 418 does not have a bonding effect (for example, approximately at 25° C. or more), so as to isolate the dummy substrate 409 and so as to remove the low-temperature coagulant 418 by volatilization thereof. Note that the low-temperature coagulant 418 may be removed by washing.

Next, heat treatment is performed. For example, after heat treatment is performed at 200° C. for 2 hours, another heat treatment is performed at 650° C. for 2 hours. Here, a change in volume of fine voids in the separation layer 408 occurs by this heat treatment. Accordingly, distortion occurs in the separation layer, so that the sheets 406, which are semiconductor substrates, become partially fragile along the separation layers 408. As heat treatment, heat treatment using a furnace or heat treatment with laser beam irradiation can be performed. In the case of performing heat treatment with laser beam irradiation, the sheets 406 can be heated through the support substrate. In addition, damage by hydrogen ion irradiation can be recovered with laser beam irradiation.

Figure 6C:
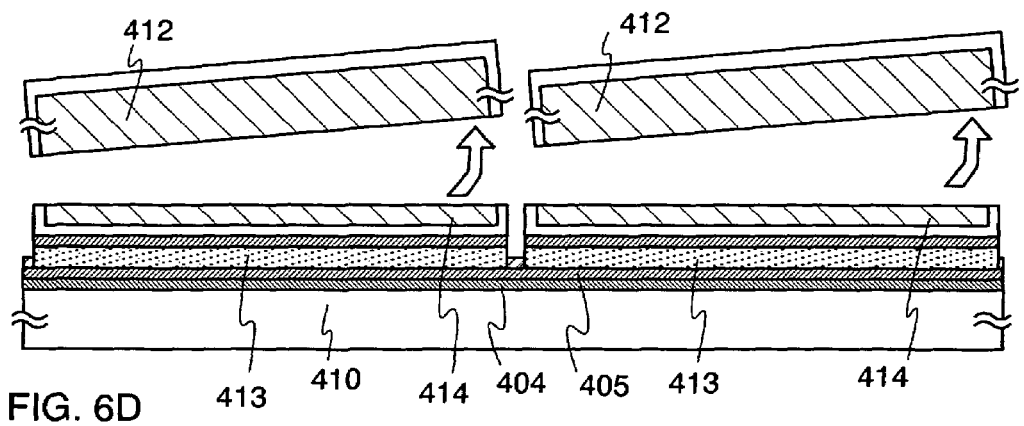

As illustrated in FIG. 6C, part 412 of the semiconductor substrates are separated from the support substrate 410 with the above-described heat treatment, along a boundary inside the separation layer or at the top interface or bottom interface of the separation layer 408. Stacks of a third bonding layer 413, the blocking layer 402, the oxide layer 401, and the single-crystal semiconductor layer 414 are formed in that order over the support substrate 410. The single-crystal semiconductor layer 214 can also be referred to as an SOI layer. In addition, the support substrate having this SOI layer can be referred to as an SOI substrate. Note that a region in which the first bonding layer 403 and the second bonding layer 411 are disposed in close contact to be bonded to each other is referred to as the third bonding layer 413.

Note that before the part 412 of the semiconductor substrates are separated from the support substrate 410, along a boundary inside the separation layer or at the top interface or bottom interface of the separation layer, a trigger is preferably made so that separation can be performed easily.

After the SOI layers are formed over the support substrate as illustrated in FIG. 6C, as planarization treatment of surfaces of the SOI layers, CMP treatment is preferably performed. Alternatively, the surfaces of the SOI layers may be irradiated with a laser beam. Note that laser beam irradiation is preferably performed in a nitrogen atmosphere with an oxygen concentration of less than or equal to 10 ppm. This is because there is a concern that the surfaces of the SOI layers may be roughened when laser beam irradiation is performed in an oxygen atmosphere. Treatment such as CMP may be performed in order to thin the SOI layers which are obtained.

Figure 6D:
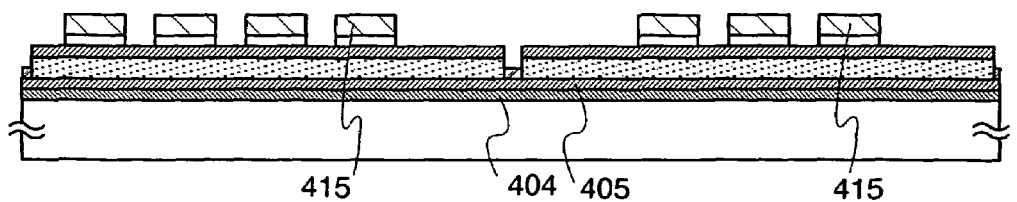

Lastly, the single-crystal semiconductor layers 414 are patterned using a photolithography technique as illustrated in FIG. 6D to form island-shaped semiconductor layers 415.

Note that this embodiment mode can be freely combined with Embodiment Mode 1. The apparatus of FIG. 4A which is described in Embodiment Mode 1 can also be used in this embodiment mode.

Note that the size of the rectangular sheets 406 can be determined depending on its use, as appropriate. For example, in the case where a 730×920 mm sized glass substrate is used as the support substrate 410 and the SOI layers are provided thereover with the above-described method, the rectangular sheets 406, the number of which is 7×6, may be arranged with the size of the rectangular sheets 406 being 100×150 mm and intervals being approximately 1 mm as described in Embodiment Mode 1, for example. In this case, the rectangular sheets can be cut off from an 8-inch silicon wafer, for example. In a similar case of a 680×880 mm sized glass substrate, rectangular sheets, the number of which is 6×7, may be arranged with the size of the rectangular sheets 406 being 100×120 mm and intervals being approximately 1 mm.

Through the above-described steps, alignment can be performed easily in arranging and forming a plurality of single-crystal semiconductor layers over a large-sized glass substrate which is a support substrate; therefore, mass production of an SOI substrate can be performed.

Embodiment Mode 3

This embodiment mode will describe an example in which a semiconductor device is manufactured using a plurality of single-crystal semiconductor layers which are formed over a support substrate, which are manufactured according to Embodiment Mode 1 or 2.

A semiconductor device having a light-emitting element can be formed by application of the present invention, and the light-emitting element emits light by any one of bottom emission, top emission, or dual emission. This embodiment mode describes an example of a method for manufacturing a semiconductor device for manufacturing with high yield, in which a semiconductor device having a display function (also referred to as a display device or a light-emitting device) is manufactured as a bottom-emission, dual-emission, or top-emission semiconductor device with high performance and high reliability, with reference to FIGS. 7A and 7B, and FIG. 8.

Figure 7A:
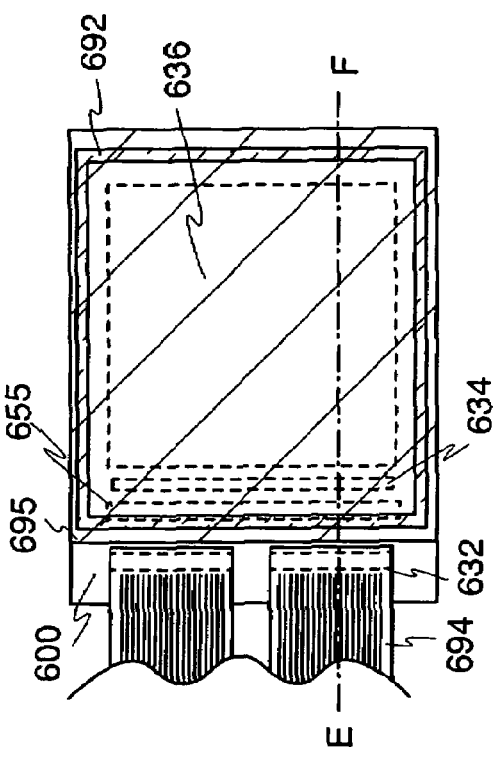
FIGS. 7A and 7B are a top view and a cross-sectional view each illustrating a structure of a semiconductor device in Embodiment Mode 3 of the present invention.
Figure 7B:
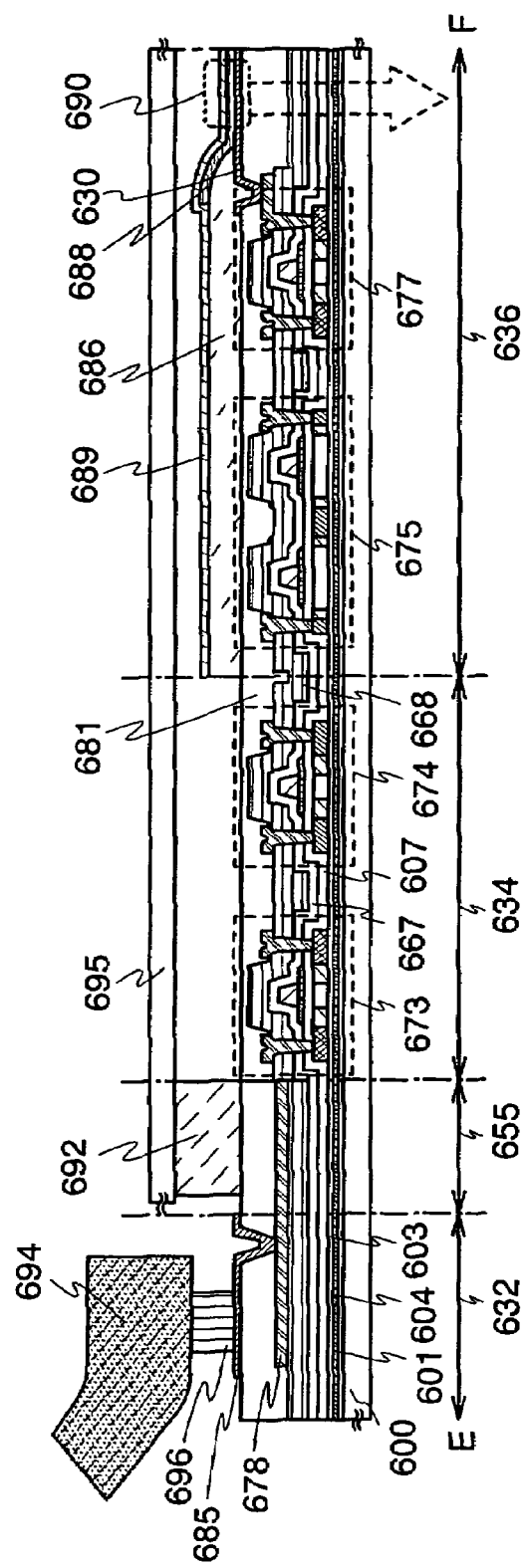

FIGS. 7A and 7B illustrate a structure of a semiconductor device in this embodiment mode. FIG. 7A is a plan view of a semiconductor device, and FIG. 7B is a cross-sectional view taken along line E-F in FIG. 7A. An external terminal connection region 632 to which an FPC 694 is attached, a connection region 655, a peripheral driver circuit region 634, and a pixel region 636 are illustrated in each of FIGS. 7A and 7B. A terminal electrode layer 678 which is connected to an external terminal is provided in the external terminal connection region 632. The FPC 694 is connected to the terminal electrode layer 678 via an anisotropic conductive layer 696 and an electrode layer 685. The electrode layer 685 is formed in the same step as the pixel electrode layer 630. In the connection region 655, a second electrode 689 is connected to a wiring in a lower layer.

First, island-shaped single-crystal semiconductor layers are formed over a support substrate 600, which is a glass substrate, according to Embodiment Mode 1. Note that since details of the method are described in Embodiment Mode 1, they are omitted here and the method is described briefly.

Here, the support substrate 600 over which a first silicon nitride oxide layer 601 is formed and a first bonding layer is formed thereover is prepared. In addition, a semiconductor substrate is prepared over which a laminate 603 of a silicon oxynitride layer and a second silicon nitride oxide layer formed thereover is formed, and a second bonding layer is formed thereover. Note that at least two semiconductor substrates are prepared per support substrate, and each of the semiconductor substrates are processed into a rectangular shape, in which a separation layer is provided therein. Then, after the semiconductor substrates is positioned over a dummy substrate to fix both of the substrates, the support substrate and the semiconductor substrates are attached to each other so that the first bonding layer and the second bonding layer are bonded to each other. When the first bonding layer and the second bonding layer are bonded to each other, the interface therebetween becomes unclear; therefore, the first and second bonding layers are illustrated as a bonding layer 604 in FIG. 7B.

After the dummy substrate is isolated, part of the semiconductor substrates are separated, along a boundary inside the separation layer or at the top interface or bottom interface of the separation layer, to form single-crystal semiconductor layers over the support substrate 600. Then, the single-crystal semiconductor layers are etched using a photolithography technique to form island-shaped single-crystal semiconductor layers. As in Embodiment Mode 1 a stepper exposure apparatus is used also in this embodiment mode, and light exposure of one shot is performed because a light exposure area is almost the same as the area of one rectangular semiconductor substrate (also referred to as a sheet). Note that arrangement of the island-shaped single-crystal semiconductor layers may also be determined according to Embodiment Mode 1.

Here, an example is described in which bonding is performed in accordance with Embodiment Mode 1. In the case where bonding is performed according to Embodiment Mode 2 instead of Embodiment Mode 1, a thermal oxide layer containing halogen is formed in contact with the single-crystal semiconductor layers between the bonding layer 604 and the single-crystal semiconductor layers.

Then, a gate insulating layer 607 which covers island-shaped single-crystal semiconductor layers is formed. The gate insulating layer 607 is formed of an insulating film containing silicon with a thickness of 10 to 150 nm by a plasma CVD method, a sputtering method, or the like. The gate insulating layer 607 may be formed with a material such as an oxide material or nitride material of silicon, typified by silicon nitride, silicon oxide, silicon oxynitride, or silicon nitride oxide, and may have a stacked-layer structure or a single-layer structure. Further, the gate insulating layer 607 may be a stacked layer of three layers including a silicon nitride film, a silicon oxide film, and a silicon nitride film. Preferably, a silicon nitride film with dense film quality is used. A thin silicon oxide film having a thickness of 1 to 100 nm, preferably 1 to 10 nm, and more preferably 2 to 5 nm is formed between the single-crystal semiconductor layers and the gate insulating layer 607. As the thin silicon oxide film, the surfaces of the single-crystal semiconductor layers are oxidized by a GRTA method, an LRTA method, or the like to form a thermal oxide film, which can be used. Note that a rare gas element such as argon is contained in a reaction gas, so that the rare gas element can be mixed in an insulating film which is formed and a dense insulating film with less gate leakage current at a low film formation temperature can be formed.

Next, a first conductive film having a thickness of 20 to 100 nm and a second conductive film having a thickness of 100 to 400 nm, which together serve as a gate electrode layer or a connection electrode, are stacked over the gate insulating layer 607. The first conductive film and the second conductive film can be formed by a sputtering method, an evaporation method, a CVD method, or the like. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), or an alloy or a compound including any of those elements as a main component. A semiconductor film typified by a polycrystalline silicon film that is doped with an impurity element such as phosphorus or a film formed with an AgPdCu alloy may also be used as the first conductive film and the second conductive film. Without limitation to the two-layer structure, for example, a three-layer structure in which a tungsten film having a thickness of 50 nm as a first conductive film, an aluminum-silicon alloy (Al—Si) film having a thickness of 500 nm as a second conductive film, and a titanium nitride film having a thickness of 30 nm as a third conductive film are sequentially stacked may be employed. In the case of the three-layer structure, a tungsten nitride film may be used instead of a tungsten film as the first conductive film; an aluminum-titanium alloy (Al—Ti) film may be used instead of an aluminum-silicon alloy (Al—Si) film as the second conductive film; or a titanium film may be used instead of a titanium nitride film as the third conductive film. Note that a single-layer structure may be employed.

Then, a resist mask is formed using a photolithography method, and each of the first conductive film and the second conductive film is processed into a desired shape. Etching can be performed by an inductively coupled plasma (ICP) etching method by adjusting etching conditions (the amount of electric power applied to a coil-shaped electrode layer, the amount of electric power applied to an electrode layer on the side of a substrate, a temperature of the electrode on the side of a substrate, and the like), as appropriate, so that the first conductive film and the second conductive film each have a desired tapered shape. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used, as appropriate. In this embodiment mode, the second conductive film is etched using an etching gas containing $CF_4$, $Cl_2$, and $O_2$, and the first conductive film is successively etched using an etching gas containing $CF_4$ and $Cl_2$.

Then, the second conductive film is further processed to have a taper angle larger than a taper angle of a side surface of the first conductive film, using the same mask as the resist mask which is used in the above-described etching process. In this embodiment mode, $Cl_2$, $SF_6$, and $O_2$ are used as an etching gas for forming a conductive layer having a tapered shape. With a tapered shape, coverage of a film to be stacked thereover is improved and a defect is reduced; thus, reliability is improved. Thus, an electrode having such a shape as illustrated in FIGS. 7A and 7B is formed, that is, an electrode, in which a second conductive film having a smaller width than the first conductive film and having a tapered shape on its side surface is provided over the first conductive film, is formed. This electrode is formed over each of the island-shaped single-crystal semiconductor layers and functions as a gate electrode layer or a connection electrode for connection with another wiring.

Note that the shape of the gate electrode layer is not limited to the one illustrated in FIGS. 7A and 7B. The gate electrode may have a single-layer structure or an electrode structure having a sidewall on its side wall.

Then, a first n-type impurity region is formed by adding an impurity element imparting n-type conductivity to each of the single-crystal semiconductor layers, using the electrode having a tapered shape as a mask. In this embodiment mode, doping is performed using phosphine ($PH_3$) as a doping gas containing an impurity element (the doping gas is a gas in which $PH_3$ is diluted with hydrogen ($H_2$), and the $PH_3$ rate in the doping gas is 5%). In this embodiment mode, phosphorus (P) is used as an impurity element imparting n-type conductivity.

In this embodiment mode, regions in impurity regions, which overlap with the gate electrode layers, with the gate insulating layer interposed therebetween, are referred to as Lov regions. Further, regions in impurity regions, which do not overlap with the gate electrode layers, with the gate insulating layer interposed therebetween, are referred to as Loff regions. In FIGS. 7A and 7B, the impurity regions are illustrated by hatching and blank spaces (or dotted hatching). This does not mean that the blank spaces are not doped with impurity elements, but makes it easy to understand that the concentration distribution of the impurity element in these regions reflects the mask and doping condition. Note that the same can be said for the other drawings of this specification.

Then, a mask which covers part of a single-crystal semiconductor layer of the transistor 673 which is to be a p-channel thin film transistor, and, in a pixel portion, a single-crystal semiconductor layer of the transistor 677 which is to be a p-channel thin film transistor for switching is formed. Then, a second n-type impurity region is formed by adding an impurity element imparting n-type conductivity. In this embodiment mode, doping is performed using phosphine ($PH_3$) as a doping gas containing an impurity element (the doping gas is a gas in which $PH_3$ is diluted with hydrogen ($H_2$), and the $PH_3$ rate in the doping gas is 5%). The second n-type impurity region is a high concentration n-type impurity region, which functions as a source region or a drain region. A third n-type impurity region which is doped through the first conductive film is a low concentration impurity region which functions as a lightly doped drain (LDD) region. The third n-type impurity region is a Lov region, which can relieve an electric field around a drain and suppress deterioration of an on current due to hot carriers.

Then, the resist masks are removed, and resist masks which cover single-crystal semiconductor layers of the transistors 674 and 675 which are to be n-channel thin film transistors are formed. Then, a p-type impurity region is formed by adding an impurity element imparting p-type conductivity. In this embodiment mode, boron (B) is used as an impurity element imparting p-type conductivity. Doping is performed using diborane ($B_2H_6$) as a doping gas containing an impurity element (the doping gas is a gas in which $B_2H_6$ is diluted with hydrogen ($H_2$), and the $B_2H_6$ rate in the doping gas is 15%). The p-type impurity region is a high concentration p-type impurity region which functions as a source region or a drain region.

Then, the resist mask is removed by $O_2$ ashing or using a resist stripping solution. After that, an insulating film, that is, a so-called sidewall may be formed to cover a side surface of the gate electrode layer. The sidewall can be formed of an insulating film having silicon which is formed by a plasma CVD method or a low pressure CVD (LPCVD) method.

Heat treatment, intense light irradiation, or laser beam irradiation may be performed in order to activate the impurity element. At the same time as the activation, plasma damage to the gate insulating layer and plasma damage to an interface between the gate insulating layer and the single-crystal semiconductor layer can be recovered.

Next, a first interlayer insulating layer which covers an electrode layer having a two-layer structure and the gate insulating layer 607 is formed. In this embodiment mode, a stacked-layer structure of insulating films 667 and 668 is employed. A silicon nitride oxide layer is formed as the insulating film 667 with a thickness of 100 nm and a silicon oxynitride film is formed as the insulating film 668 with a thickness of 900 nm. In this embodiment mode, the insulating films 667 and 668 are successively formed by a plasma CVD method. The insulating films 667 and 668 are not limited to the above-described films. The insulating films 667 and 668 may be a silicon nitride film, a silicon nitride oxide film, a silicon oxynitride film, or a silicon oxide film which is formed by a sputtering method or a plasma CVD method. A single layer structure or a stacked-layer structure of three or more layers using another insulating film including silicon may be employed.

The insulating films 667 and 668 can alternatively be formed using an aluminum nitride (AlN) film, an aluminum oxynitride (AlON) film, an aluminum nitride oxide (AlNO) film containing more nitrogen than oxygen, an aluminum oxide film, diamond-like carbon (DLC), a nitrogen-containing carbon (CN) film, or another film containing an inorganic insulating material. Alternatively, a siloxane resin may be used. Note that a siloxane resin is a resin including a Si—O—Si bond. Siloxane has a skeleton structure formed of a bond of silicon (Si) and oxygen (O) and has an organic group containing at least hydrogen (e.g., an alkyl group or an aryl group) or a fluoro group as a substituent. Siloxane may have both an organic group containing at least hydrogen and a fluoro group as a substituent. Alternatively, an organic insulating material such as polyimide, acrylic, polyamide, polyimide amide, resist, benzocyclobutene, or polysilazane can be used. A flat film which is formed by an application method may be used.

Next, a plurality of contact holes (openings) which reach the single-crystal semiconductor layers are formed by selectively etching the insulating films 667 and 668 and the gate insulating layer 607, using a resist mask. Etching may be performed once or plural times depending on a selectivity of a material to be used.

Then, a conductive film is formed to cover each of the openings, and the conductive film is etched to form a connection electrode which is electrically connected to part of a source region or a drain region.

Each connection electrode can be formed by forming a conductive film by a PVD method, a CVD method, an evaporation method, or the like, and then, etching the conductive film into a desired shape. Alternatively, a conductive layer can be selectively formed in a predetermined position by a droplet discharge method, a printing method, an electroplating method, or the like. Further, a reflow method or a damascene method may be employed. Each connection electrode can be formed using a metal such as Ag, Au, Cu, Ni, Pt, Pd, Ir, Rh, W, Al, Ta, Mo, Cd, Zn, Fe, Ti, Zr, or Ba, or Si or Ge, an alloy or nitride thereof. A stacked-layer structure of films formed from any of those materials may alternatively be employed. In this embodiment mode, a titanium (Ti) film is formed with a thickness of 60 nm, a titanium nitride film is formed with a thickness of 40 nm, an aluminum film is formed with a thickness of 700 nm, and a titanium (Ti) film is formed with a thickness of 200 nm to obtain a stacked-layer structure, and the stacked layer is processed into a desired shape.

Through the above-described process, an active matrix substrate can be manufactured, in which the peripheral driver circuit region 634 includes a transistor 673 which is a p-channel thin film transistor having a p-type impurity region in an Lov region and a transistor 674 which is an n-channel thin film transistor having an n-type impurity region in an Lov region; and the pixel region 636 includes a transistor 675 which is a multi-channel type n-channel thin film transistor having an n-type impurity region in a Loff region and a transistor 677 which is a p-channel thin film transistor. The active matrix substrate can be used for a display device including a light-emitting element 690.

Note that the method for manufacturing a semiconductor device, which is described in this embodiment mode, can be applied to transistors of a top gate type (a planar type), a bottom gate type (an inversely staggered type), a dual gate type having two gate electrode layers which are arranged above and below a channel region, each with a gate insulating film interposed therebetween, or other structures, without limitation to the thin film transistors described in this embodiment mode.

Then, an insulating film 681 is formed as a second interlayer insulating layer. The second insulating film 681 can be formed of a material selected from silicon oxide, silicon nitride, silicon oxynitride, silicon nitride oxide, aluminum nitride, aluminum oxynitride (AlON), aluminum nitride oxide (AlNO) containing more nitrogen than oxygen, aluminum oxide, diamond-like carbon (DLC), nitrogen-containing carbon (CN), phosphosilicate glass (PSG), borophosphosilicate glass (BPSG), alumina, polysilazane, or another substance containing an inorganic insulating material. Alternatively, a siloxane resin may be used. An organic insulating material may alternatively be used, and either a photosensitive material or a nonphotosensitive material may be used as an organic material. For example, polyimide, acrylic, polyamide, polyimide amide, resist, or benzocyclobutene can be used.

In this embodiment mode, the interlayer insulating layer provided for planarization is required to have a high heat resistant property, a high insulating property, and high flatness. Therefore, the insulating film 681 is preferably formed by using an application method typified by a spin coating method.

The insulating film 681 can be formed by using dipping, spray coating, a doctor knife, a roll coater, a curtain coater, a knife coater, a CVD method, an evaporation method, or the like. The insulating film 681 may be formed by a droplet discharge method. In the case of using a droplet discharge method, a liquid material can be saved. A method for forming a pattern without a mask like a droplet discharge method, for example, a printing method (i.e., a method of forming a pattern such as screen printing or offset printing) can be used.

Next, an opening which reaches a connection electrode of the p-channel transistor 677, that is, a contact hole is formed by etching the insulating film 681 in the pixel region 636.

Next, the pixel electrode layer 630 which is electrically connected to the connection electrode is formed. The pixel electrode layer 630 functions as a first electrode which is one of two electrodes which is included in the light-emitting element 690. The pixel electrode layer 630 can be formed using indium tin oxide, indium zinc oxide (IZO) in which zinc oxide is mixed with indium oxide, a conductive material in which silicon oxide is mixed with indium oxide, organic indium, organic tin, indium oxide containing tungsten oxide, indium zinc oxide containing tungsten oxide, indium oxide containing titanium oxide, or indium tin oxide containing titanium oxide.

A conductive composition containing a conductive macromolecule (also referred to as a conductive polymer) can be used for the pixel electrode layer 630. When a thin film of a conductive composition is formed as the pixel electrode layer, the thin film preferably has a sheet resistance of less than or equal to 10000 $\Omega/m^2$ and a light transmittance of greater than or equal to 70% at a wavelength of 550 nm. Note that a resistance of a conductive macromolecule which is included in the thin film is preferably less than or equal to 0.1 $\Omega \cdot cm$.

As a conductive macromolecule, so-called π electron conjugated macromolecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive macromolecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

Any of the above-described conductive macromolecules may be used alone as a conductive composition for the pixel electrode layer. Alternatively, any of the above-described conductive macromolecules can be used with an organic resin added thereto to adjust film characteristics such as the intensity of the film of a conductive composition.

As for an organic resin, as long as a resin is compatible to a conductive macromolecule or a resin can be mixed and dispersed into a conductive macromolecule, a thermosetting resin, a thermoplastic resin, or a photocurable resin may be used. For example, the following can be given: a polyester-based resin such as polyethylene terephthalate, polybutylene terephthalate, or polyethylene naphthalate; a polyimide-based resin such as polyimide or polyimide amide; a polyamide resin such as polyamide 6, polyamide 6,6, polyamide 12, or polyamide 11; a fluorine resin such as polyvinylidene fluoride, polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins.

Further, a conductive composition may be doped with an acceptor dopant or a donor dopant so that oxidation-reduction potential of a conjugated electron in a conjugated conductive macromolecule may be changed in order to adjust conductivity of the conductive composition.

A halogen compound, a Lewis acid, a protonic acid, an organic cyano compound, an organic metal compound, or the like can be used as an acceptor dopant. Examples of a halogen compound are chlorine, bromine, iodine, iodine chloride, iodine bromide, and iodine fluoride. Examples of a Lewis acid are phosphorus pentafluoride, arsenic pentafluoride, antimony pentafluoride, boron trifluoride, boron trichloride, and boron tribromide. Examples of a protonic acid include an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As organic carboxylic acid and organic sulfonic acid, the foregoing organic carboxylic acid compound and an organic sulfonic acid compound can be used. As an organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene are given.

As a donor dopant, alkali metal, alkaline-earth metal, a quaternary amine compound, or the like can be used.

A conductive composition is dissolved in water or an organic solvent (e.g., an alcohol-based solvent, a ketone-based solvent, an ester-based solvent, a hydrocarbon-based solvent, or an aromatic-based solvent) and a thin film which serves as a pixel electrode layer can be formed by a wet process.

A solvent which dissolves a conductive composition is not particularly limited. A solvent which dissolves the above-described conductive macromolecules and high molecular resin compounds such as an organic resin may be used. For example, a conductive composition may be dissolved in any one of or mixture of water; methanol, ethanol, Propylene carbonate, N-methylpyrrolidone, dimethylformamide, dimethylacetamide, cyclohexanone, acetone, methyl ethyl ketone, methyl isobutyl ketone, or toluene.

After the conductive composition is dissolved in a solvent as described above, a film thereof can be formed by a wet process, such as an application method, a coating method, a droplet discharge method (also referred to as an inkjet method), or a printing method. The solvent may dried with heat treatment or may be dried under reduced pressure. In the case where the organic resin is a thermosetting resin, heat treatment may be further performed. In the case where the organic resin is a photocurable resin, light irradiation treatment may be performed.

Then, an insulator 686 which serves as a partition wall which covers an edge of the pixel electrode layer 630 is formed.

Then, a layer 688 containing an organic compound is formed selectively over the pixel electrode layer 630 by an evaporation method, an inkjet method, or the like.

Then, the second electrode 689 is formed over the layer 688 containing an organic compound. The second electrode forms a pair of electrodes with the first electrode of the light-emitting element 690. The electrodes make the layer 688 containing an organic compound, which is disposed therebetween, emit light.

A semiconductor device in FIGS. 7A and 7B has the pixel electrode layer 630 which is formed of a light-transmitting conductive material so that light emitted from the light-emitting element 690 can be transmitted therethrough, and the second electrode 689 which is formed of a reflective conductive material so that light emitted from the light-emitting element 690 is reflected. As the second electrode 689, a conductive film of, for example, titanium, tungsten, nickel, gold, platinum, silver, copper, tantalum, molybdenum, aluminum, magnesium, calcium, lithium, or alloy of any of those materials may be used, as long as the material has reflectiveness. A substance which has high reflectivity with respect to light in a visible light region is preferably used. In this embodiment mode, an aluminum film is used.

The light-emitting element 690 thus obtained is sealed with a sealing substrate 695. The support substrate 600 and the sealing substrate 695 are bonded to each other with a sealant 692.

Note that an etching process may be performed by either plasma etching (dry etching) or wet etching. Plasma etching is suitable for processing a large-area substrate. As an etching gas, a fluorine-based gas such as $CF_4$ or $NF_3$ or a chlorine-based gas such as $Cl_2$ or $BCl_3$ is used, and an inert gas such as He or Ar may be added thereto, as appropriate. With an etching process by discharge at atmospheric pressure being utilized, local electric discharge can be performed and layer which serves as a mask is not necessarily formed over the entire surface of the substrate.

Further, a conductive layer to form a layer which serves as a wiring or an electrode, a layer which serves as a mask used for forming a predetermined pattern, and the like may be formed by a method by which a pattern can be formed selectively, such as a droplet discharge method. A droplet discharge (eject) method (also referred to as an inkjet method depending on its system) can form a predetermined pattern (of a conductive layer, an insulating layer, or the like) by selectively discharging (ejecting) droplets of a composition prepared for a specific purpose. In such a method, treatment for controlling wettability or adhesiveness may be performed on a region on which the pattern is formed. Alternatively, a method by which a pattern can be formed without an etching process, for example, a printing method (a method by which a pattern is formed, such as screen printing or offset printing), can be used.

As for a mask which is used in a photolithography technique, a resin material such as an epoxy resin, an acrylic resin, a phenol resin, a novolac resin, a melamine resin, or a urethane resin is used. The mask may be formed using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a positive resist, a negative resist, or the like may be used. In the case of a droplet discharge method, the surface tension and viscosity of any material, which is used, are adjusted as appropriate by, for example, adjusting the concentration of a solvent or adding a surfactant or the like.

While the semiconductor device in FIGS. 7A and 7B has a structure in which light is emitted in a direction indicated by the arrow (bottom emission), the structure thereof is not particularly limited, and the semiconductor device may have a structure in which light is emitted in a direction opposite to the direction indicated by the arrow (top emission) or a dual emission structure in which light is emitted from both the top and bottom surfaces.

Figure 8:
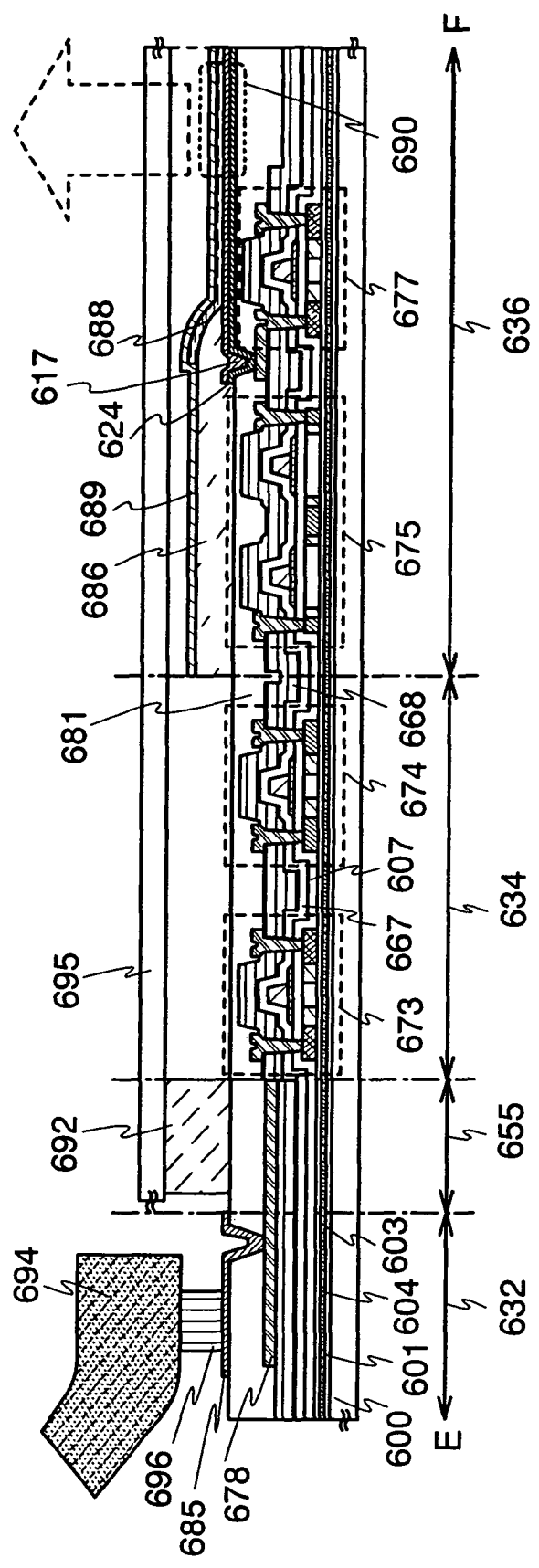
FIG. 8 is a cross-sectional view illustrating a structure of a semiconductor device in Embodiment Mode 3 of the present invention.

FIG. 8 shows another structure of a semiconductor device in this embodiment mode. A semiconductor device of FIG. 8 has a structure in which light is emitted in a direction indicated by the arrow (top emission). Note that although structures of electrodes of light-emitting elements and the size of the insulators 686 are different between FIG. 8 and FIG. 7B, other part are the same and thus description of the same portions are omitted here. Note that the same reference numerals as those in FIG. 7B are used in FIG. 8.

A wiring layer 624 which is a reflective metal layer is formed under a first electrode 617 of the light-emitting element 690. The first electrode 617 which is a transparent conductive film is formed over the wiring layer 624. As the wiring layer 624, a conductive film of, for example, titanium, tungsten, nickel, gold, platinum, silver, copper, tantalum, molybdenum, aluminum, magnesium, calcium, lithium, or alloy of any of those materials may be used, as long as the material has reflectiveness. A substance which has high reflectivity with respect to light in a visible region is preferably used. Any of these conductive films may also be used as the first electrode 617, and in that case, if it is not necessary to stack the first electrode 617 and the wiring layer 624, the first electrode 617 may be a single layer without the reflective wiring layer 624.

The first electrode 617 and the second electrode 689 may each be formed using a transparent conductive film formed of a light-transmitting conductive material, and, specifically, indium oxide containing tungsten oxide, indium zinc oxide containing tungsten oxide, indium oxide containing titanium oxide, indium tin oxide containing titanium oxide, or the like can be used. Needless to say, indium tin oxide, indium zinc oxide, indium tin oxide to which silicon oxide is added, or the like can also be used.

Even when the second electrode 689 is formed of a material having no light-transmitting property such as a metal film, light can be emitted through the second electrode 689 if the thickness of the second electrode 689 is formed small (preferably a thickness of approximately 5 to 30 nm) so as to be able to transmit light. As a metal thin film which can be used for the second electrode 689, a conductive film formed of titanium, tungsten, nickel, gold, platinum, silver, aluminum, magnesium, calcium, lithium, an alloy of any of those materials, or the like can be used.

When a top emission structure shown in FIG. 8 is employed, an aperture ratio can be easily high, that is, an area of a light-emitting region can be easily large; therefore, even when a panel includes a unit cell having four TFTs and a unit cell having two TFTs, the area of light-emitting regions of unit cells can be the same. Accordingly, a panel which has a light-emitting region larger than that in the pixel structure described in Embodiment Mode 1 can be manufactured.

This embodiment mode can be freely combined with Embodiment Mode 1 or 2.

Embodiment Mode 4

This embodiment mode will describe structures of light-emitting elements that can be used for display elements in the semiconductor device of the present invention with reference to FIGS. 9A to 9D.

FIGS. 9A to 9D each illustrate an element structure of a light-emitting element in which an EL layer 860 is sandwiched between a first electrode 870 and a second electrode 850. The EL layer 860 includes a first layer 804, a second layer 803, and a third layer 802, as illustrated in the drawings. In FIGS. 9A to 9D, the second layer 803 is a light-emitting layer, and the first layer 804 and the third layer 802 are functional layers.

The first layer 804 has a function of transporting and injecting holes into the second layer 803. A hole-injecting layer included in the first layer 804 contains a substance having a high hole-injecting property. As a substance having a high hole-injecting property, molybdenum oxide, vanadium oxide, ruthenium oxide, tungsten oxide, manganese oxide, or the like can be used. Alternatively, the first layer 804 can be formed using phthalocyanine (abbreviation: $H_2Pc$) or a phthalocyanine compound such as copper phthalocyanine (abbreviation: CuPc); an aromatic amine compound such as 4,4'-bis[N-(4-diphenylaminophenyl)-N-phenylamino]biphenyl (abbreviation: DPAB) or 4,4'-bis(N-{4-[N-(3-methylphenyl)-N-phenylamino]phenyl}-N-phenylamino)biphenyl (abbreviation: DNTPD); a polymer such as poly(ethylene dioxythiophene)/poly(styrenesulfonic acid) (abbreviation: PEDOT/PSS); or the like.

Further, a composite material including an organic compound and an inorganic compound can be used for the hole-injecting layer. In particular, a composite material including an organic compound and an inorganic compound showing an electron-accepting property with respect to the organic compound is excellent in a hole-injecting property and a hole-transporting property because electrons are transferred between the organic compound and the inorganic compound and carrier density is increased.

In the case where a composite material including an organic compound and an inorganic compound is used for the hole-injecting layer, the hole-injecting layer can form an ohmic contact with the electrode layer; therefore, a material of the electrode layer can be selected regardless of a work function.

As the inorganic compound used for the composite material, oxide of a transition metal is preferably used. Oxide of a metal belonging to Groups 4 to 8 of the periodic table can be used. Specifically, the following are preferable because of a high electron-accepting property: vanadium oxide, niobium oxide, tantalum oxide, chromium oxide, molybdenum oxide, tungsten oxide, manganese oxide, and rhenium oxide. Among them, molybdenum oxide is particularly preferable because of stability in the atmosphere, low hygroscopicity, and easiness of handling.

As the organic compound used for the composite material, various compounds such as an aromatic amine compound, a carbazole derivative, aromatic hydrocarbon, or a high molecular compound (e.g., an oligomer, a dendrimer, or a polymer) can be used. Note that the organic compound used for the composite material is preferably an organic compound having a high hole-transporting property. Specifically, it is preferable to use a substance having a hole mobility of greater than or equal to $10^{-6}$ cm$^2$/Vs. Note that other materials having a higher hole-transporting property than an electron-transporting property may be used. Examples of the organic compound which can be used for the composite material are specifically shown below.

For example, as the aromatic amine compound, the following can be given: N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), and the like.

As specific examples of the carbazole derivative which can be used for the composite material, the following can be given: 3-[N-(9-phenylcarbazol-3-yl)-N-phenylamino]-9-phenylcarbazole (abbreviation: PCzPCA1, 3,6-bis[N-(9-phenylcarbazol-3-yl)-N-phenylamino]-9-phenylcarbazole (abbreviation: PCzPCA2), 3-[N-(1-naphthyl)-N-(9-phenyl-carbazol-3-yl)amino]-9-phenylcarbazole (abbreviation: PCzPCN1), and the like.

Further, the following can be used: 4,4'-di(N-carbazolyl) biphenyl (abbreviation: CBP), 1,3,5-tris[4-(N-carbazolyl) phenyl]benzene (abbreviation: TCPB), 9-[4-(N-carbazolyl)] phenyl-10-phenylanthracene (abbreviation: CzPA), 1,4-bis [4-(N-carbazolyl)phenyl]-2,3,5,6-tetraphenylbenzene, and the like.

As the aromatic hydrocarbon which can be used for the composite material, for example, the following can be given: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl) phenyl]anthracene, 9,10-bis[2-(1-naphthyl)phenyl]anthracene, 2,3,6,7-tetramethyl-9,10-di(1-naphthyl) anthracene, 2,3,6,7-tetramethyl-9,10-di(2-naphthyl) anthracene, 9,9'-bianthryl, 10,10'-diphenyl-9,9'-bianthryl, 10,10'-bis(2-phenylphenyl)-9,9'-bianthryl, 10,10'-bis[(2,3,4, 5,6-pentaphenyl)phenyl]-9,9'-bianthryl, anthracene, tetracene, rubrene, perylene, 2,5,8,11-tetra(tert-butyl)perylene, and the like. Alternatively, pentacene, coronene, or the like can be used. As described above, it is more preferable to use an aromatic hydrocarbon which has a hole mobility of greater than or equal to $1\times10^{-6}$ cm$^2$/Vs and of which the carbon number is 14 to 42.

Note that the aromatic hydrocarbon which can be used for the composite material may have a vinyl skeleton. As examples of the aromatic hydrocarbon having a vinyl group, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given.

Alternatively, a high molecular compound such as poly(N-vinylcarbazole) (abbreviation: PVK) or poly(4-vinyltriphenylamine) (abbreviation: PVTPA) can be used.

A hole-transporting layer included in the first layer 804 contains a substance having a high hole-transporting property. Specifically, it is preferable that a substance having a high hole-transporting property be an aromatic amine compound (that is, a compound having a benzene ring-nitrogen bond). As examples of a material which are widely used, the following can be given: 4,4'-bis[N-(3-methylphenyl)-N-phenylamino]biphenyl, a derivative thereof such as 4,4'-bis[N-(1-napthyl)-N-phenylamino]biphenyl (hereinafter referred to as NPB), and a starburst aromatic amine compound such as 4,4',4''-tris(N,N-diphenylamino)triphenylamine, and 4,4',4''-tris[N-(3-methylphenyl)-N-phenylamino]triphenylamine.

Most of those substances described here have a hole mobility of greater than or equal to $10^{-6}$ cm$^2$/Vs. Note that other materials having a higher a hole-transporting property than an electron-transporting property may be used. The hole-transporting layer is not limited to a single layer and may be a mixed layer of any of the above-described substances or a stack which includes two or more layers of any of the above-described substances.

The third layer 802 has a function of transporting and injecting electrons into the second layer 803. As an electron-transporting layer included in the third layer 802, a substance having a high electron-transporting property can be used. For example, a metal complex or the like having a quinoline or benzoquinoline skeleton, such as tris(8-quinolinolato)aluminum(III) (abbreviation: Alq), tris(4-methyl-8-quinolinolato) aluminum(III) (abbreviation: Almq$_3$), bis(10-hydroxybenzo [h]quinolinato)beryllium(II) (abbreviation: BeBq$_2$), or bis(2-methyl-8-quinolinolato)(4-phenylphenolato)aluminum(III) (abbreviation: BAlq) can be used. Alternatively, a metal complex or the like having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc(II) (abbreviation: Zn(BTZ)$_2$) can be used. Further alternatively, other than metal complexes, the following can be used: 2-(4-biphenylyl)-5-(4-tert-butylphenyl)-1,3, 4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), and the like can be used. Most of those substances described here mainly have an electron mobility of greater than or equal to $10^{-6}$ cm$^2$/Vs. Note that other materials having a higher electron-transporting property than a hole-transporting property may be used. The electron-transporting layer is not limited to a single layer and may be a stack which includes two or more layers of any of the above-described substances.

As an electron-injecting layer included in the third layer 802, a substance having a high electron-injecting property can be used. As a substance having a high electron-injecting property, an alkali metal, an alkaline earth metal, or a compound thereof such as lithium fluoride (LiF), cesium fluoride (CsF), or calcium fluoride (CaF$_2$) can be used. For example, a layer of a substance having an electron-transporting property and contains an alkali metal, an alkaline earth metal, or a compound thereof, for example, a layer of Alq containing magnesium (Mg) or the like can be used. It is preferable to use the layer of a substance having an electron-transporting property and contains an alkali metal or an alkaline earth metal as the electron-injecting layer because electron injection from the electrode layer is efficiently performed by using the layer.

Next, the second layer 803 which is a light-emitting layer is described. The light-emitting layer has a function of emitting light and contains an organic compound having a light-emitting property. Further, the light-emitting layer may include an inorganic compound. The light-emitting layer may be formed using various light-emitting organic compounds and inorganic compounds. It is preferable that the thickness of the light-emitting layer be approximately 10 to 100 nm.

The organic compound used for the light-emitting layer is not particularly limited as long as it has a light-emitting property. For example, the following can be given: 9,10-di(2- naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl) perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(joulolidin-9-yl)ethenyl]-4H-pyran (abbreviation: DCM2), and 4-(dicyanomethylene)-2,6-bis[p-(dimethylamino)styryl]-4H-pyran (abbreviation: BisDCM). Alternatively, a compound capable of emitting phosphorescence such as bis[2-(4',6'-difluorophenyl)pyridinato-N,$C^{2'}$]iridium (picolinate) (abbreviation: FIrpic), bis{2-[3',5'-bis(trifluoromethyl)phenyl]pyridinato-N,$C^{2'}$}iridium(picolinate) (abbreviation: Ir($CF_3$ppy)$_2$(pic)), tris(2-phenylpyridinato-N,$C^{2'}$) iridium (abbreviation: Ir(ppy)$_3$), bis(2-phenylpyridinato-N,$C^{2'}$)iridium(acetylacetonate) (abbreviation: Ir(ppy)$_2$(acac)), bis[2-(2'-thienyl)pyridinato-N,$C^{3'}$]iridium(acetylacetonate) (abbreviation: Ir(thp)$_2$(acac)), bis(2-phenylquinolinato-N,$C^{2'}$)iridium(acetylacetonate) (abbreviation: Ir(pq)$_2$(acac)), or bis[2-(2'-benzothienyl)pyridinato-N,$C^{3'}$]iridium(acetylacetonate) (abbreviation: Ir(btp)$_2$(acac)) can be used.

Further, a triplet excitation light-emitting material containing a metal complex or the like may be used for the light-emitting layer, in addition to a singlet excitation light-emitting material. For example, among pixels emitting red, green, and blue light, the pixel emitting red light whose luminance is reduced by half in a relatively short time is formed using a triplet excitation light-emitting material and the other pixels are formed using a singlet excitation light-emitting material. Since a triplet excitation light-emitting material has favorable light-emitting efficiency, less power is consumed to obtain the same luminance. In other words, when a triplet excitation light-emitting material is used for the pixel emitting red light, a smaller amount of current is necessary to be applied to a light-emitting element; therefore, reliability can be improved. The pixel emitting red light and the pixel emitting green light may be formed using a triplet excitation light-emitting material and the pixel emitting blue light may be formed using a singlet excitation light-emitting material in order to achieve low power consumption. Low power consumption can be further achieved when a light-emitting element emitting green light, which has high visibility to human eyes, is formed of a triplet excitation light-emitting material.

Not only the above-described organic compounds which emit light but also another organic compound may be further added to the light-emitting layer. Examples of the organic compound that can be added are TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, DPVBi, and the like, which are mentioned above, and 4,4'-bis(N-carbazolyl)biphenyl (abbreviation: CBP) and 1,3,5-tris[4-(N-carbazolyl)phenyl]benzene (abbreviation: TCPB) can be alternatively used. However, the material of the light-emitting layer is not limited thereto. It is preferable that the organic compound which is added in addition to the organic compound which emits light have a larger excitation energy and be added in a larger amount than the organic compound which emits light, in order to make the organic compound emit light efficiently (thus, concentration quenching of the organic compound can be prevented). Further, as another function, the added organic compound may emit light with the organic compound (thus, white light emission or the like can be performed).

The light-emitting layer may have a structure in which color display is performed by formation of light-emitting layers having different emission wavelength ranges for pixels. Typically, light-emitting layers corresponding to colors of R (red), G (green), and B (blue) are formed. In this case, color purity can be improved and a pixel region can be prevented from having a mirror surface (reflection) by provision of a filter which transmits light of an emission wavelength range of the pixel on the light-emission side of the pixel. A circularly polarizing plate or the like that has been conventionally considered to be necessary can be omitted by provision of the filter, and the loss of light emitted from the light-emitting layer can be eliminated. Further, change in color tone, which occurs when a pixel region (a display screen) is obliquely seen, can be reduced.

Either a low-molecular organic light-emitting material or a high-molecular organic light-emitting material may be used for a material which can be used for the light-emitting layer. A high-molecular organic light-emitting material has higher physical strength than a low-molecular material, and an element using the high-molecular organic light-emitting material has higher durability than an element using a low-molecular material. In addition, since a high-molecular organic light-emitting material can be formed by coating, the element can be formed relatively easily.

The color of light emission is determined depending on a material forming the light-emitting layer; therefore, a light-emitting element which emits light of a desired color can be formed by selecting an appropriate material for the light-emitting layer. As a high-molecular electroluminescent material which can be used for forming the light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2,2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The inorganic compound used for the light-emitting layer may be any inorganic compound as long as light emission of the organic compound is not easily quenched by the inorganic compound, and various kinds of metal oxide and metal nitride can be used. In particular, an oxide of a metal that belongs to Group 13 or 14 of the periodic table is preferable because light emission of the organic compound is not easily quenched, and specifically, aluminum oxide, gallium oxide, silicon oxide, and germanium oxide are preferable. However, the inorganic compound is not limited thereto.

Note that the light-emitting layer may be formed by stacking a plurality of layers each having a combination of the organic compound and the inorganic compound, which are described above, or may further contain another organic compound or inorganic compound. A layer structure of the light-emitting layer can be changed, and an electrode layer for injecting electrons may be provided or light-emitting materials may be dispersed, instead of provision of a specific electron-injecting region or a light-emitting region. Such a change can be permitted unless it departs from the spirit of the present invention.

A light-emitting element formed with the above materials emits light by being forwardly biased. A pixel of a semiconductor device which is formed using a light-emitting element can be driven by a passive matrix mode or an active matrix mode. In either case, each pixel emits light by application of forward bias thereto at a specific timing; however, the pixel is in a non-light-emitting state for a certain period. Reliability of a light-emitting element can be improved by application of reverse bias in the non-light-emitting time. In a light-emitting element, there is a deterioration mode in which light-emission intensity is decreased under a constant driving condition or a deterioration mode in which luminance is apparently reduced due to expansion of a non-light-emitting region within the pixel. However, progression of deterioration can be slowed down by performing alternating driving in which bias is applied forwardly and reversely; thus, reliability of a semiconductor device including a light-emitting element can be improved. In addition, either digital driving or analog driving can be applied.

A color filter (colored layer) may be provided for a sealing substrate. The color filter (colored layer) can be formed by an evaporation method or a droplet discharge method. High-definition display can also be performed using the color filter (colored layer). This is because a broad peak can be modified to be sharp in a light emission spectrum of each of RGB by the color filter (colored layer).

Full color display can be performed by formation of a material emitting monochromatic light in combination with a color filter or a color conversion layer. The color filter (colored layer) or the color conversion layer may be provided for, for example, the sealing substrate, and the sealing substrate may be attached to an element substrate.

Needless to say, display of monochromatic light emission may be performed. For example, an area color type semiconductor device may be formed with the use of monochromatic light emission.

Figure 9A:
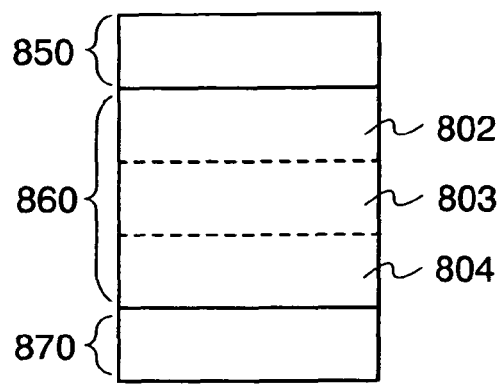
FIGS. 9A to 9D are views each illustrating an element structure of a light-emitting element in Embodiment Mode 4 of the present invention.
Figure 9A:
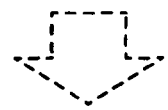
Figure 9B:
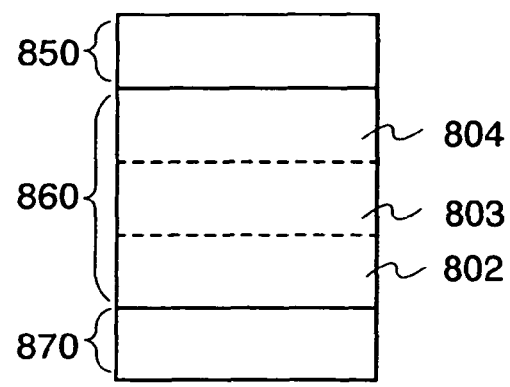
Figure 9B:

It is necessary to select materials of the first electrode 870 and the second electrode 850 in consideration of the work function. Either the first electrode 870 or the second electrode 850 can be an anode (an electrode layer with high potential) or a cathode (an electrode layer with low potential) depending on the pixel structure. In the case where the polarity of a driving thin film transistor is a p-channel type, the first electrode 870 may serve as an anode and the second electrode 850 may serve as a cathode, as illustrated in FIG. 9A. In the case where the polarity of the driving thin film transistor is an n-channel type, the first electrode 870 may serve as a cathode and the second electrode 850 may serve as an anode, as illustrated in FIG. 9B. Materials that can be used for the first electrode 870 and the second electrode 850 are described below. It is preferable to use a material having a high work function (specifically a material having a work function of 4.5 eV or more) for one of the first electrode 870 and the second electrode 850 which functions as an anode, and a material having a low work function (specifically a material having a work function of 3.5 eV or more) for the other electrode which function as a cathode. However, since the first layer 804 is excellent in a hole-injecting property and a hole-transporting property and the third layer 802 is excellent in an electron-injecting property and an electron-transporting property, both the first electrode 870 and the second electrode 850 are scarcely restricted by a work function and various materials can be used.

Since the light-emitting elements in FIGS. 9A and 9B each have a structure in which light is taken out from the first electrode 870, the second electrode 850 does not necessarily have a light-transmitting property. The second electrode 850 may be formed of a film mainly containing an element selected from Ti, Ni, W, Cr, Pt, Zn, Sn, In, Ta, Al, Cu, Au, Ag, Mg, Ca, Li or Mo, or an alloy material or a compound material containing any of those elements as its main component, such as titanium nitride, $TiSi_xN_y$, $WSi_x$, tungsten nitride, $WSi_xN_y$, or NbN; or a stacked-layer film thereof with a total thickness in the range of from 100 to 800 nm.

In addition, when the second electrode 850 is formed using such a light-transmitting conductive material as the material used for the first electrode 870, light can be taken out also from the second electrode 850 in its structure, and a dual emission structure can be obtained in which light from the light-emitting element is emitted through both the first electrode 870 and the second electrode 850.

Note that the light-emitting element of the present invention can have variations by change in types of the first electrode 870 and the second electrode 850.

FIG. 9B illustrates the case where the EL layer 860 is structured by the third layer 802, the second layer 803, and the first layer 804 in this sequence, from the first electrode 870 side.

Figure 9C:
Figure 9C:
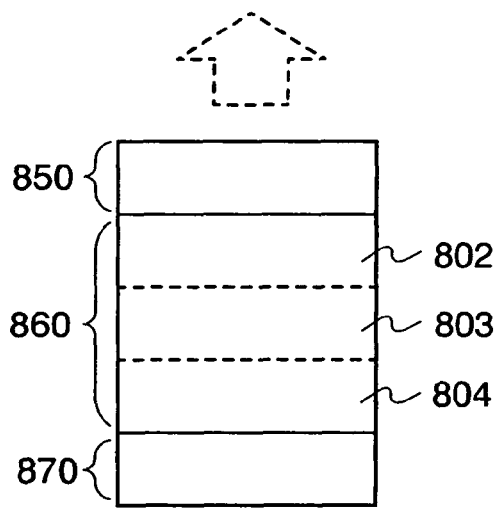
Figure 9D:
Figure 9D:
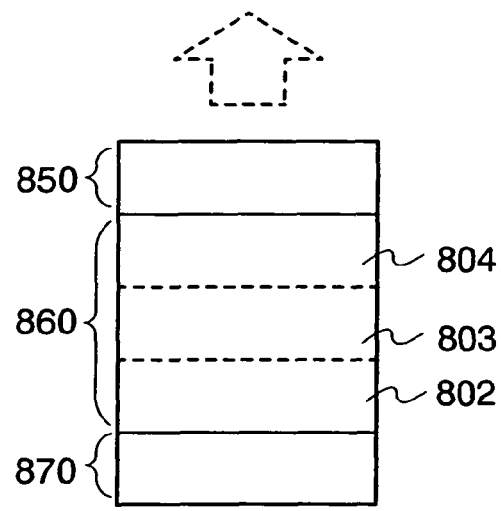

FIG. 9C illustrates a structure in which an electrode having reflectivity is used for the first electrode 870 and an electrode having a light-transmitting property is used for the second electrode 850 in FIG. 9A, and in which light emitted from the light-emitting element is reflected by the first electrode 870, transmitted through the second electrode 850, and emitted to the outside. Similarly, FIG. 9D illustrates a structure in which an electrode having reflectivity is used for the first electrode 870 and an electrode having a light-transmitting property is used for the second electrode 850 in FIG. 9B, and in which light emitted from the light-emitting element is reflected by the first electrode 870, transmitted through the second electrode 850, and emitted to the outside.

Further, various methods can be used as a method for forming the EL layer 860 when an organic compound and an inorganic compound are mixed to provide the EL layer 860. For example, there is a co-evaporation method for vaporizing both an organic compound and an inorganic compound by resistance heating. Alternatively, co-evaporation may be performed in which an inorganic compound may be vaporized by an electron beam (EB) while an organic compound is vaporized by resistance heating. Still alternatively, a method for sputtering an inorganic compound at the same time as vaporization of an organic compound by resistance heating to deposit the both at the same time may be used. Further still alternatively, the EL layer 860 may be formed by a wet process.

As a method for manufacturing the first electrode 870 and the second electrode 850, an evaporation method by resistance heating, an EB evaporation method, a sputtering method, a CVD method, a spin coating method, a printing method, a dispenser method, a droplet discharge method, or the like can be used.

This embodiment mode can be freely combined with any of Embodiment Modes 1 to 3. If a manufacturing method described in Embodiment Mode 1 or 2 is used, even in the case of a large-sized semiconductor device, a semiconductor device including a light-emitting element having high performance and high reliability can be manufactured with high throughput and high productivity.

Embodiment Mode 5

Figure 10A:
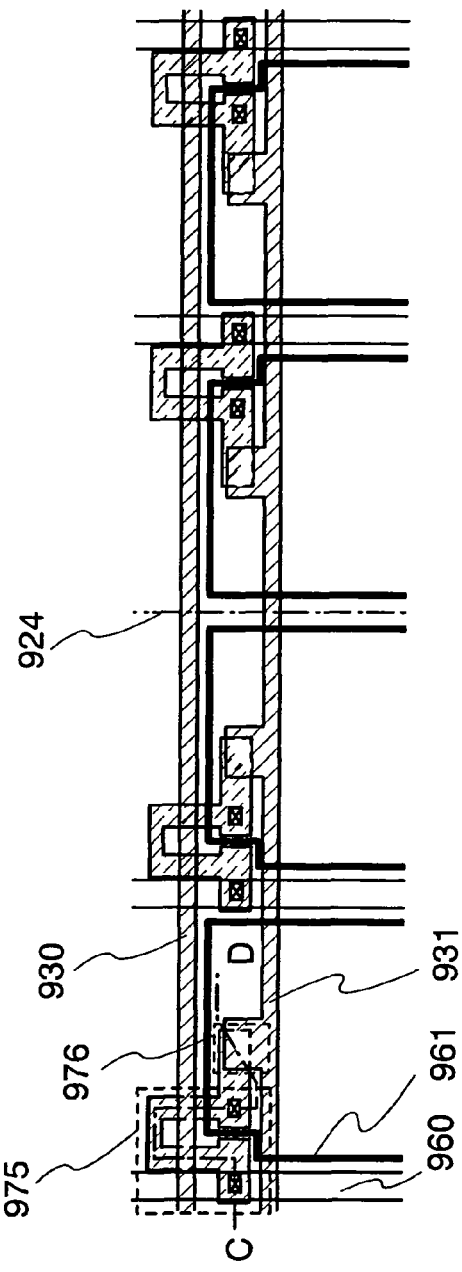
FIGS. 10A and 10B are a top view and a cross-sectional view each illustrating a structure of a semiconductor device using a liquid crystal element in Embodiment Mode 5 of the present invention.
Figure 10B:
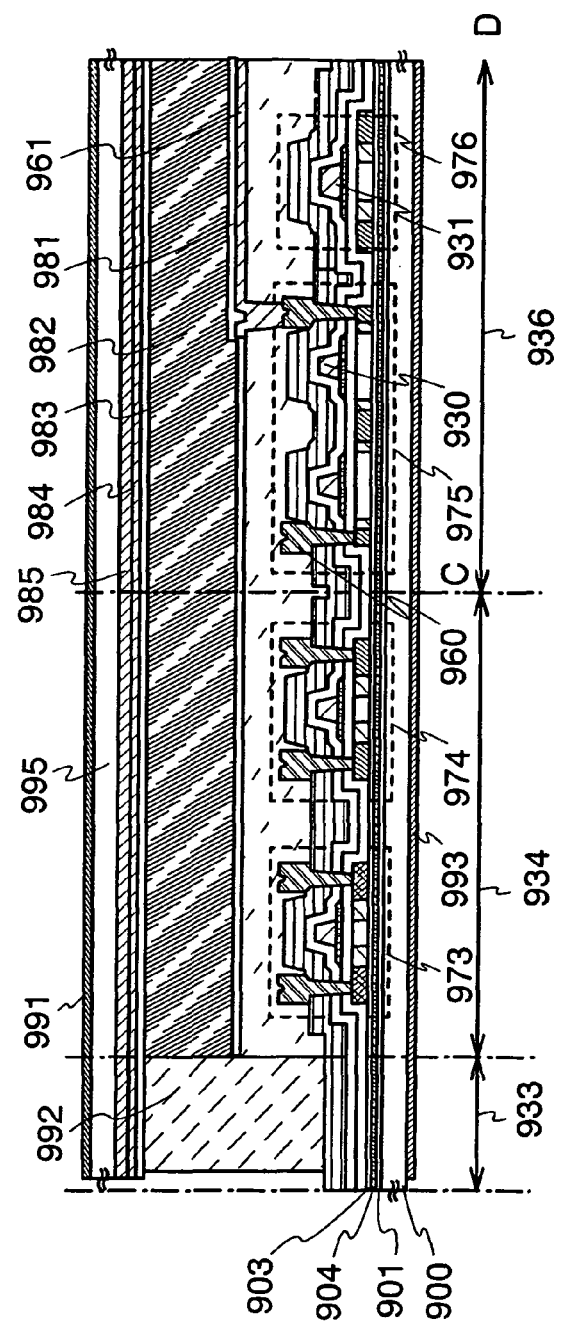

While Embodiment Mode 3 describes a manufacturing example of a semiconductor device using a light-emitting element, this embodiment mode will describe a manufacturing example of a semiconductor device using a liquid crystal element with reference to FIGS. 10A and 10B.

FIGS. 10A and 10B illustrates a structure of a semiconductor device using a liquid crystal element in this embodiment mode. First, an island-shaped single-crystal semiconductor layer is formed over a support substrate 900, which is a glass substrate, according to Embodiment Mode 2. Note that since details of the method are described in Embodiment Mode 2, they are omitted here and the method is described briefly.

Here, the support substrate 900 over which a first silicon nitride oxide layer 901 is formed and a first bonding layer is formed over the first silicon nitride oxide layer 901 is prepared. In addition, a semiconductor substrate provided with an oxide film 903 which is formed through heat treatment at a temperature of 700° C. or more in an atmosphere containing HCl at 0.5 to 10% by volume (preferably 3% by volume) with respect to oxygen and a second bonding layer thereover is prepared. Note that at least two semiconductor substrates are prepared per support substrate, and each of the semiconductor substrates are processed into a rectangular shape. A separation layer is formed in each of the substrates. Then, after the semiconductor substrate is positioned over a dummy substrate to fix both of the substrates, the support substrate and the semiconductor substrates are attached to each other so that the first bonding layer and the second bonding layer are bonded to each other. When the first bonding layer and the second bonding layer are bonded to each other, the interface therebetween becomes unclear; therefore, the first and the second bonding layers are illustrated as a bonding layer 904 in FIG. 10B.

Then, after the dummy substrate is isolated, part of the semiconductor substrates are separated, along a boundary inside the separation layer or at the top interface or bottom interface of the separation layer, to form single-crystal semiconductor layers over the support substrate 900. Then, the single-crystal semiconductor layers are etched using a photolithography technique to form island-shaped single-crystal semiconductor layers. As in Embodiment Mode 1 a stepper exposure apparatus is used also in this embodiment mode, and light exposure of one shot is performed because a light exposure area is almost the same as the area of one rectangular semiconductor substrate (also referred to as a sheet). Note that arrangement of the island-shaped single-crystal semiconductor layers is also determined according to Embodiment Mode 1.

Since the following steps, that is, a method for manufacturing a TFT using a single-crystal semiconductor layer is almost the same as those in Embodiment Mode 3, description of the details is omitted here. Note that TFTs used in a light-emitting device and TFTs used in a liquid crystal display device have different intended use; therefore, channel lengths and channel widths are adjusted as appropriate, and TFTs in a light-emitting device and in a liquid crystal display device have different designs. In particular, a light-emitting device includes a unit cell having two or more TFTs, while a liquid crystal display device can be manufactured using a unit cell having one TFT. In addition, while a light-emitting device includes a power supply line, a liquid crystal display device does not include a power supply line and includes a capacitor line. In a liquid crystal display device, n-channel TFTs may be used alone if a driver circuit is not formed over the same substrate.

FIG. 10A illustrates an example of a top view of a pixel. A boundary line 924 indicated by a chain line in FIG. 10A is a juncture between different semiconductor substrates which are attached. Pixel electrode layers 961 are arranged in one direction and the boundary line 924 is positioned therebetween. The pixel structure is symmetric with respect to the boundary line 924. Thus, a single-crystal semiconductor layer can be kept away from the boundary line 924. Although the single-crystal semiconductor layers are located in the unit cells which are next to each other with the boundary line 924 therebetween, a sufficient distance can be kept between the single-crystal semiconductor layer and the boundary line 924.

In addition, a capacitor line 931 overlaps with the single-crystal semiconductor layer with an insulating film therebetween to form a storage capacitor, thus, a capacitor portion 976 is formed. A transistor 975 that is a multi-channel type n-channel thin film transistor is disposed in the vicinity of an intersection of a gate wiring 930 and a source wiring 960. The gate wiring 930 overlaps with the single-crystal semiconductor layer with an insulating film therebetween and the overlapping portion serves as a channel formation region of a TFT. The single-crystal semiconductor layer is electrically connected to the source wiring 960 through a contact hole. In addition, the single-crystal semiconductor layer is electrically connected to the pixel electrode layer 961 through a contact hole.

In the case of a transmissive liquid crystal display device, the pixel electrode layer 961 can be formed using indium tin oxide, indium zinc oxide (IZO) in which zinc oxide is mixed with indium oxide, a conductive material in which silicon oxide is mixed with indium oxide, organic indium, organic tin, indium oxide containing tungsten oxide, indium zinc oxide containing tungsten oxide, indium oxide containing titanium oxide, or indium tin oxide containing titanium oxide. Alternatively, in the case of a reflective liquid crystal display device, aluminum, silver, or an alloy thereof is used for the pixel electrode layer 961.

Note that a cross-sectional view taken along dotted line C-D in FIG. 10A corresponds to a pixel region 936 in FIG. 10B. Note that FIG. 10A is a top view of a liquid crystal display device in which steps up to formation of a pixel electrode are performed. FIG. 10B is a cross-sectional view of a liquid crystal display device in which a sealing substrate 995 is attached with a sealant 992 and a polarizer is further provided.

A liquid crystal display device illustrated in FIG. 10B includes a sealing region 933, a driver circuit region 934, and the pixel region 936. In addition, the driver circuit region 934 includes a transistor 973 which is a p-channel thin film transistor having a p-type impurity region in its Lov region, and a transistor 974 which is an n-channel thin film transistor having an n-channel impurity region in its Lov region. An insulating layer 981 which is referred to as an alignment film is formed over the pixel electrode layer 961 by a printing method or a droplet discharge method. Then, rubbing treatment is performed. Note that rubbing treatment is not performed in a case of a liquid crystal mode, for example, in a case of a VA mode. An insulating layer 983 which functions as an alignment film which is provided for the sealing substrate 995 is similar to the insulating layer 981. The sealing substrate 995 has a conductive layer 984 which functions as a counter electrode, a color layer 985 which functions as a color filter, and a polarizer 991 (also referred to as a polarizing plate), in addition to the insulating layer 983. In addition, the sealing substrate 995 may have a shielding film (a black matrix) or the like.

Since the liquid crystal display device of this embodiment mode is of a transmissive type, a polarizer 993 (a polarizing plate) is provided on an opposite side of the support substrate 900 from elements. A retardation plate may be stacked between the polarizing plate and a liquid crystal layer. In addition, an anti-reflection film which prevents external light from being reflected to a viewing side may be provided on the viewing side which is a nearest side to a user.

Note that the color filter is not provided in some cases where light-emitting diodes (LEDs) of RGB or the like are arranged as a backlight and a successive additive color mixing method (a field sequential method) in which color display is performed by time division is employed. The black matrix may be provided so as to overlap with a transistor and a CMOS circuit in order to reduce reflection of external light by wirings of the transistor and the CMOS circuit. Note that the black matrix may be provided so as to overlap with the capacitor element. This is because reflection by a metal film forming the capacitor element can be prevented.

The liquid crystal layer 982 can be formed by a dispenser method (a dripping method), or an injecting method by which liquid crystal is injected using a capillary action after attaching the substrate 900 having elements to the sealing substrate 995. A dripping method is preferably employed when using a large substrate to which an injecting method is not easily applied.

Spacers may be provided in such a way that particles each having a size of several micro millimeters are dispersed, or the spacers may be formed by a method by which a resin film is formed over the entire surface of the substrate and then etched.

In this embodiment mode, the oxide layer 903 includes halogen. The oxide film can function as a protective film which captures an impurity such as metal and prevent contamination of the single-crystal semiconductor layer. Thus, reliability can be improved.

Embodiment Mode 6

Various semiconductor devices having a display function can be manufactured by application of the present invention. In other words, the present invention can be applied to various electronic devices in which these semiconductor devices, having a display function, are incorporated into display portions. This embodiment mode describes examples of electronic devices including a semiconductor device for achieving high performance and high reliability.

As electronic devices related to the present invention, television devices (also simply referred to as televisions or television receivers), cameras such as digital cameras or digital video cameras, mobile phone sets (also simply referred to as mobile phones or cell-phones), portable information terminals such as PDAs, portable game machines, monitors for computers, computers, audio reproducing devices such as car audio systems, image reproducing devices provided with a recording medium such as home game machines (specifically a digital versatile disc (DVD)), and the like can be given. Specific examples of such electronic devices are described with reference to FIGS. 11A to 11C.

A television device can be completed using a semiconductor device which includes a display element which is formed according to the present invention. An example of a television device for achieving high performance and high reliability is described with reference to FIG. 11A.

A television device can be completed by incorporating a display module into a housing. A display panel as illustrated in FIGS. 7A and 7B in which components up to an FPC are set is generally also referred to as an EL display module. When an EL display module as illustrated in FIGS. 7A and 7B is used, an EL television device can be completed. A display panel as illustrated in FIGS. 10A and 10B is generally also referred to as a liquid crystal display module. When a liquid crystal display module as illustrated in FIGS. 10A and 10B is used, a liquid crystal television device can be completed. A main screen 2003 can be formed using a display module, and other accessories such as speaker portions 2009 and an operation switch are provided. Thus, a television device can be completed according to the present invention.

Figure 11A:
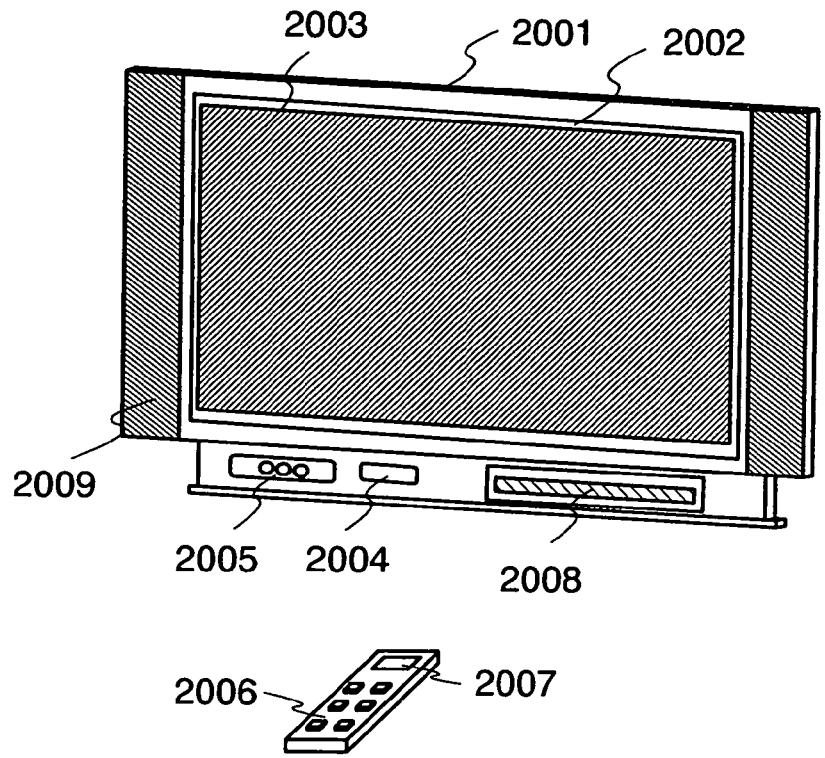
FIGS. 11A to 11C are views each illustrating an electronic device in Embodiment Mode 6 of the present invention.

A display panel 2002 using a display element is incorporated into a housing 2001, as shown in FIG. 11A. The television device can receive general TV broadcast by a receiver 2005 and further can be connected to a wired or wireless communication network via a modem 2004 so that one-way (from a sender to a receiver) or two-way (between a sender and a receiver or between receivers) information communication can be performed. The television device can be operated by a switch of the housing or a separate remote control unit 2006, which may have a display portion 2007 for displaying information to be outputted.

The television device may include a sub screen 2008 formed using a second display panel for displaying channels, sound volume, and the like, in addition to the main screen 2003 formed using a first display panel. In this structure, the main screen 2003 may be formed using an EL display panel superior in viewing angle, and the sub screen 2008 may be formed using a liquid crystal display panel which can display an image with low power consumption. Alternatively, a structure in which the main screen 2003 is formed of a liquid crystal display panel, the sub screen 2008 is formed of an EL display panel, and the sub screen can blink may be employed, when reduction in power consumption is prioritized. According to the present invention, a display device with high performance and high reliability can be manufactured with high productivity even if a large substrate and a number of TFTs and electronic part are used.

According to the present invention, a semiconductor device with high performance and high reliability which has a display function can be manufactured with high productivity. Therefore, a television device with high performance and high reliability can be manufactured with high productivity.

Figure 11B:
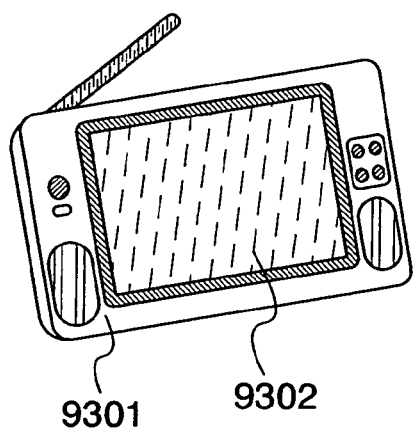

A portable television device illustrated in FIG. 11B includes a main body 9301, a display portion 9302, and the like. A semiconductor device of the present invention can be applied to the display portion 9302. Thus, a portable television device with high performance and high reliability can be provided. In addition, a semiconductor device of the present invention can be applied to various types of televisions including a medium-sized television which is portable and a large-sized television (for example, 40 inches or more).

Figure 11C:
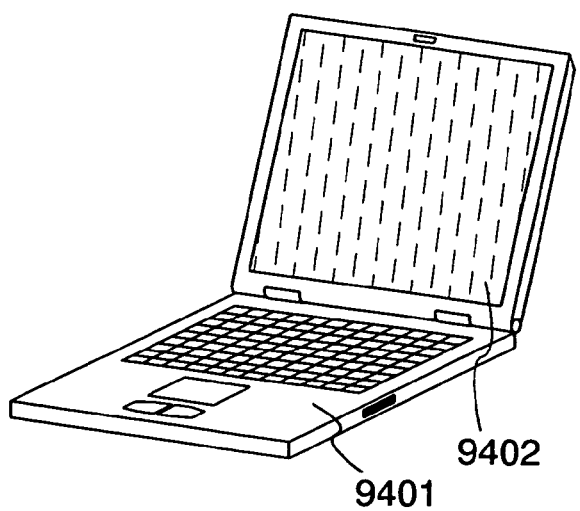

A portable computer illustrated in FIG. 11C includes a main body 9401, a display portion 9402, and the like. A semiconductor device of the present invention can be applied to the display portion 9402. A semiconductor device having a 15-inch display portion can be manufactured according to Embodiment Mode 1. Thus, a portable computer with high performance and high reliability can be provided.

This embodiment mode can be freely combined with any of Embodiment Modes 1 to 5.

The present application is based on Japanese Patent Application serial No. 2007-146889 filed with Japan Patent Office on Jun. 1, 2007, the entire contents of which are hereby incorporated by reference.

EXPLANATION OF REFERENCE

11. dummy substrate holding unit, 12. sheet storage unit, 13. sheet transfer unit, 14. support substrate holding unit, 200. semiconductor substrate, 201. silicon oxynitride layer, 202. silicon nitride oxide layer, 203. first bonding layer, 204. silicon oxynitride layer, 205. silicon nitride oxide layer, 206. sheet, 208. separation layer, 209. dummy substrate, 210. support substrate, 211. second bonding layer, 212. part of semiconductor substrate, 213. third bonding layer, 214. single-crystal semiconductor layer, 215. island-shaped semiconductor layer, 217. interval, 218. low-temperature coagulant, 400. semiconductor substrate, 401. oxide layer, 402. blocking layer, 403. first bonding layer, 404. silicon oxynitride layer, 405. silicon nitride oxide layer, 406. sheet, 408. separation layer, 409. dummy substrate, 410. support substrate, 411. second bonding layer, 412. part of semiconductor substrate, 413. third bonding layer, 414. single-crystal semiconductor layer, 415. island-shaped semiconductor layer, 418. low-temperature coagulant, 600. support substrate, 601. silicon nitride oxide layer, 603. laminate, 604. bonding layer, 607. gate insulating layer, 617. first electrode, 624. wiring layer, 630. pixel electrode layer, 632. external terminal connection region, 634. peripheral driver circuit region, 636. pixel region, 655. connection region, 667. insulating film, 668. insulating film, 673. transistor, 674. transistor, 675. transistor, 677. transistor, 678. terminal electrode layer, 681. insulating film, 685. electrode layer, 686. insulator, 688. layer containing organic compound, 689. second electrode, 690. light-emitting element, 692. sealant, 694. FPC, 695. sealing substrate, 696. anisotropic conductive layer, 802. third layer, 803. second layer, 804. first layer, 850. second electrode, 860. EL layer, 870. first electrode, 900. support substrate, 901. silicon nitride oxide layer, 903. oxide layer, 904. bonding layer, 924. boundary line, 930. gate wiring, 931. capacitor line, 933. sealing region, 934. driver circuit region, 936. pixel region, 960. source wiring, 961. pixel electrode layer, 973. transistor, 974. transistor, 975. transistor, 976. capacitor portion, 981. insulating layer, 982. liquid crystal layer, 983. insulating layer, 984. conductive layer, 985. color layer, 991. polarizer, 992. sealant, 993. polarizer, 995. sealing substrate, 2001. housing, 2002. display panel, 2003. main screen, 2004. modem, 2005. receiver, 2006. remote control unit, 2007. display portion, 2008. sub screen, 2009. speaker portion, 9301. main body, 9302. display portion, 9401. main body, and 9402. display portion.

The invention claimed is:

1. A method for manufacturing a semiconductor device comprising:
    forming a separation layer in each of a plurality of single-crystal semiconductor substrates;
    arranging and fixing the plurality of single-crystal semiconductor substrates over a dummy substrate by using a low-temperature coagulant at a first temperature;
    overlapping a support substrate and the dummy substrate with the plurality of single-crystal semiconductor substrates interposed therebetween;
    heating the plurality of single-crystal semiconductor substrates to a second temperature to isolate the dummy substrate from the plurality of single-crystal semiconductor substrates, wherein the low-temperature coagulant does not have a bonding effect at the second temperature; and
    separating parts of the plurality of single-crystal semiconductor substrates at a boundary of the each separation layer to form a plurality of single-crystal semiconductor layers over the support substrate.

2. The method for manufacturing a semiconductor device according to claim 1, wherein the separating step is performed by a heat treatment.

3. The method for manufacturing a semiconductor device according to claim 1, wherein the first temperature is 10° C. or less, and the second temperature is 25° C. or more.

4. The method for manufacturing a semiconductor device according to claim 1, wherein silicon oxynitride layers are formed on the plurality of single-crystal semiconductor substrates, and the plurality of single-crystal semiconductor substrates and the support substrate are overlapped with the silicon oxynitride layers interposed therebetween.

5. The method for manufacturing a semiconductor device according to claim 1, wherein the each separation layer is formed by irradiation of ions which are accelerated by an electric field.

6. The method for manufacturing a semiconductor device according to claim 1, wherein a silicon oxynitride layer or a silicon nitride oxide layer is formed over the support substrate.

7. The method for manufacturing a semiconductor device according to claim 1, wherein each shape of the plurality of single-crystal semiconductor substrates is rectangular.

8. The method for manufacturing a semiconductor device according to claim 1, wherein the support substrate is a glass substrate.

9. The method for manufacturing a semiconductor device according to claim 1, wherein the plurality of single-crystal semiconductor layers have an interval of greater than or equal to 0.01 mm and less than or equal to 1 mm.

10. The method for manufacturing a semiconductor device according to claim 1, wherein the semiconductor device is one selected from the group consisting of a display panel, a television device, and a computer.

11. The method for manufacturing a semiconductor device according to claim 1, further comprising a step of removing the low-temperature coagulant by volatilization thereof after the heating step.

12. A method for manufacturing a semiconductor device comprising:
    forming an oxide layer on each surface of a plurality of single-crystal semiconductor substrates;
    forming a separation layer in each of the plurality of single-crystal semiconductor substrates;
    arranging and fixing the plurality of single-crystal semiconductor substrates over a dummy substrate by using a low-temperature coagulant at a first temperature;
    overlapping a support substrate and the dummy substrate with the each oxide layer and the plurality of single-crystal semiconductor substrates interposed therebetween;
    heating the plurality of single-crystal semiconductor substrates to a second temperature to isolate the dummy substrate from the plurality of single-crystal semiconductor substrates, wherein the low-temperature coagulant does not have a bonding effect at the second temperature; and
    separating parts of the plurality of single-crystal semiconductor substrates at a boundary of the respective separation layers to form a plurality of single-crystal semiconductor layers over the support substrate.

13. The method for manufacturing a semiconductor device according to claim 12, wherein the separating step is performed by a heat treatment.

14. The method for manufacturing a semiconductor device according to claim 12, wherein the first temperature is 10° C. or less, and the second temperature is 25° C. or more.

15. The method for manufacturing a semiconductor device according to claim 12, wherein silicon oxynitride layers are formed on the oxide layer, and the plurality of single-crystal semiconductor substrates and the support substrate are overlapped with the silicon oxynitride layers interposed therebetween.

16. The method for manufacturing a semiconductor device according to claim 12, wherein the each separation layer is formed by irradiation with ions which are accelerated by an electric field.

17. The method for manufacturing a semiconductor device according to claim 12, wherein a silicon oxynitride layer or a silicon nitride oxide layer is formed over the support substrate.

18. The method for manufacturing a semiconductor device according to claim 12, wherein each shape of the plurality of single-crystal semiconductor substrates is rectangular.

19. The method for manufacturing a semiconductor device according to claim 12, wherein the support substrate is a glass substrate.

20. The method for manufacturing a semiconductor device according to claim 12, wherein the plurality of single-crystal semiconductor layers have an interval of greater than or equal to 0.01 mm and less than or equal to 1 mm.

21. The method for manufacturing a semiconductor device according to claim 12, wherein the semiconductor device is one selected from the group consisting of a display panel, a television device, and a computer.

22. The method for manufacturing a semiconductor device according to claim 12, further comprising a step of removing the low-temperature coagulant by volatilization thereof after the heating step.

23. A method for manufacturing a semiconductor device comprising:
    performing a heat treatment in an oxidation atmosphere containing halogen to form an oxide layer on each surface of a plurality of single-crystal semiconductor substrates;
    forming a separation layer in each of the plurality of single-crystal semiconductor substrates;
    arranging and fixing the plurality of single-crystal semiconductor substrates over a dummy substrate by using a low-temperature coagulant at a first temperature;
    overlapping a support substrate and the dummy substrate with the oxide layers and the plurality of single-crystal semiconductor substrates interposed therebetween;
    heating the plurality of single-crystal semiconductor substrates to a second temperature to isolate the dummy substrate from the plurality of single-crystal semiconductor substrates, wherein the low-temperature coagulant does not have a bonding effect at the second temperature; and
    separating parts of the plurality of single-crystal semiconductor substrates at a boundary of the respective separation layers to form a plurality of single-crystal semiconductor layers over the support substrate.

24. The method for manufacturing a semiconductor device according to claim 23, wherein the separating step is performed by a heat treatment.

25. The method for manufacturing a semiconductor device according to claim 23, wherein the first temperature is 10° C. or less, and the second temperature is 25° C. or more.

26. The method for manufacturing a semiconductor device according to claim 23, wherein silicon oxynitride layers are formed on the oxide layers, and the plurality of single-crystal semiconductor substrates and the support substrate are overlapped with the silicon oxynitride layers interposed therebetween.

27. The method for manufacturing a semiconductor device according to claim 23, wherein the each separation layer is formed by irradiation with ions which are accelerated by an electric field.

28. The method for manufacturing a semiconductor device according to claim 23, wherein a silicon oxynitride layer or a silicon nitride oxide layer is formed over the support substrate.

29. The method for manufacturing a semiconductor device according to claim 23, wherein each shape of the plurality of single-crystal semiconductor substrates is rectangular.

30. The method for manufacturing a semiconductor device according to claim 23, wherein the support substrate is a glass substrate.

31. The method for manufacturing a semiconductor device according to claim 23, wherein the plurality of single-crystal semiconductor layers have an interval of greater than or equal to 0.01 mm and less than or equal to 1 mm.

32. The method for manufacturing a semiconductor device according to claim 23, wherein the semiconductor device is one selected from the group consisting of a display panel, a television device, and a computer.

33. The method for manufacturing a semiconductor device according to claim 23, further comprising a step of removing the low-temperature coagulant by volatilization thereof after the heating step.

* * * * *